(12) United States Patent
Kim et al.

(10) Patent No.: US 11,266,030 B2
(45) Date of Patent: Mar. 1, 2022

(54) FOLDABLE DISPLAY DEVICE

(71) Applicant: Samsung Display Co., LTD., Yongin-si (KR)

(72) Inventors: Jinhyoung Kim, Seoul (KR); Jungil Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/779,648

(22) Filed: Feb. 2, 2020

(65) Prior Publication Data

US 2020/0329569 A1 Oct. 15, 2020

(30) Foreign Application Priority Data

Apr. 15, 2019 (KR) .................... 10-2019-0043688

(51) Int. Cl.
*H05K 5/02* (2006.01)
*H05K 5/00* (2006.01)
(Continued)

(52) U.S. Cl.
CPC ........... *H05K 5/0017* (2013.01); *E05D 3/122* (2013.01); *E05D 3/18* (2013.01); *H01L 51/524* (2013.01); *H05K 5/0226* (2013.01); *E05Y 2900/606* (2013.01); *H01L 51/5253* (2013.01); *H01L 2251/5338* (2013.01)

(58) Field of Classification Search
CPC .... H05K 5/0017; H05K 5/0226; E05D 3/122; E05D 3/18; H01L 51/524; H01L 51/5253; H01L 2251/5338; E05Y 2900/606
See application file for complete search history.

(56) References Cited

U.S. PATENT DOCUMENTS 8,493,730 B2 7/2013 Shim et al.
8,713,757 B2 * 5/2014 Chen ..................... G06F 1/1624
16/354
(Continued)

FOREIGN PATENT DOCUMENTS

KR 10-2010-0092222 8/2010
KR 10-1139866 5/2012
(Continued)

*Primary Examiner* — Abhishek M Rathod
*Assistant Examiner* — Keith DePew
(74) *Attorney, Agent, or Firm* — H.C. Park & Associates, PLC

(57) ABSTRACT

A hinge member of a display device includes: first, second, and third plates which are spaced apart from each other; a first rotating shaft and a second rotating shaft to rotate the second plate; a third rotating shaft and a fourth rotating shaft to rotate the third plate; a first shaft support connected to one end of the first rotating shaft and one end of the second rotating shaft; a second shaft support connected to other end of the first rotating shaft and other end of the second rotating shaft; a third shaft support connected to one end of the third rotating shaft and one end of the fourth rotating shaft; a fourth shaft support connected to other end of the third rotating shaft and other end of the fourth rotating shaft. At least one of the first and second rotating shafts and at least one of the third and fourth rotating shafts are linearly movable in response to rotation of one of the second and third plates.

20 Claims, 16 Drawing Sheets

(51) Int. Cl.
   *H01L 51/52* (2006.01)
   *E05D 3/12* (2006.01)
   *E05D 3/18* (2006.01)

(56) References Cited

U.S. PATENT DOCUMENTS

| | | | |
|---|---|---|---|
| 9,071,673 | B2 | 6/2015 | Choi et al. |
| 9,173,287 | B1 * | 10/2015 | Kim .................. G06F 1/1647 |
| 9,930,794 | B2 * | 3/2018 | Luan .................. H05K 7/14 |
| 10,100,970 | B1 * | 10/2018 | Wu .................. E05D 11/00 |
| 10,394,062 | B1 * | 8/2019 | Song .................. G02F 1/133308 |
| 10,487,550 | B2 * | 11/2019 | Chu .................. F16M 11/38 |
| 10,585,457 | B2 * | 3/2020 | Park .................. H01L 27/323 |
| 10,858,869 | B2 * | 12/2020 | Chiang .................. E05D 3/06 |
| 2010/0201604 | A1 | 8/2010 | Kee et al. |
| 2012/0149438 | A1 | 6/2012 | Kwon |
| 2012/0264489 | A1 * | 10/2012 | Choi .................. H04M 1/0268 |
| | | | 455/566 |
| 2013/0010405 | A1 * | 1/2013 | Rothkopf .................. H05K 5/0226 |
| | | | 361/679.01 |
| 2015/0366089 | A1 * | 12/2015 | Park .................. G06F 1/1641 |
| | | | 361/679.01 |
| 2015/0374145 | A1 * | 12/2015 | Lindblom .................. A47F 3/004 |
| | | | 211/187 |
| 2017/0115701 | A1 * | 4/2017 | Bae .................. G06F 1/16 |
| 2019/0302850 | A1 * | 10/2019 | Park .................. H04M 1/0216 |
| 2020/0117245 | A1 * | 4/2020 | Ou .................. G06F 1/1624 |
| 2020/0264674 | A1 * | 8/2020 | Km .................. G06F 1/1616 |
| 2020/0341508 | A1 * | 10/2020 | Hwang .................. G06F 1/1622 |

FOREIGN PATENT DOCUMENTS

| | | |
|---|---|---|
| KR | 10-1839615 | 10/2012 |
| KR | 10-1636077 | 7/2016 |

* cited by examiner

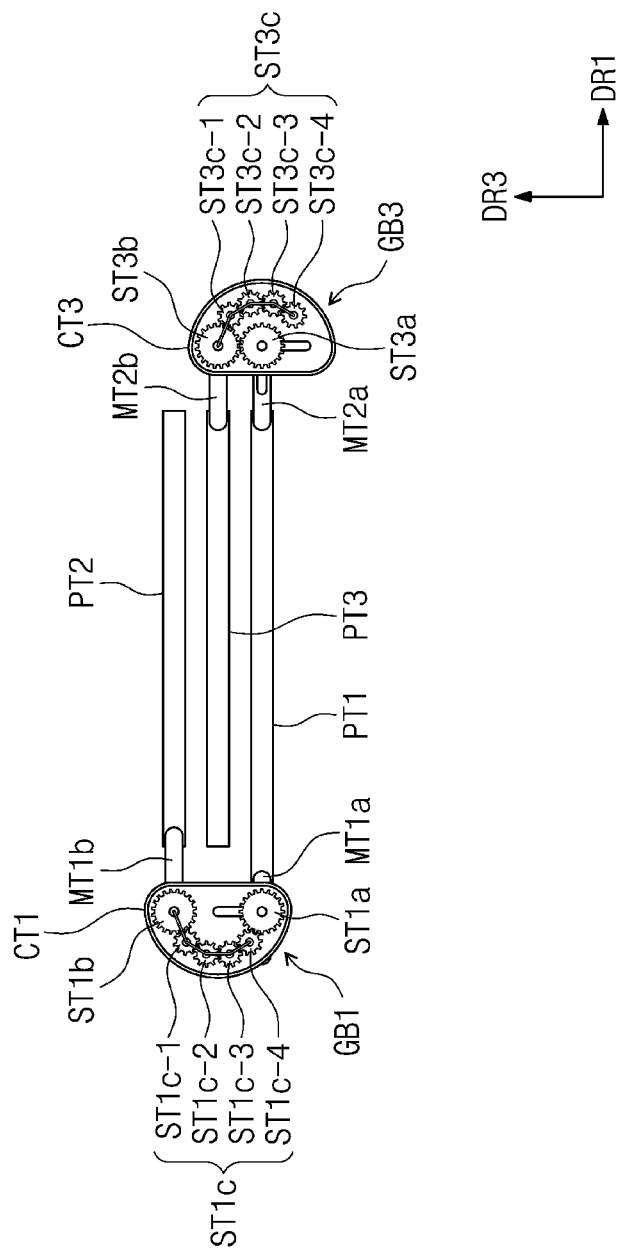

FOLDABLE DISPLAY DEVICE

CROSS REFERENCE TO RELATED APPLICATION

This application claims priority from and the benefit of Korean Patent Application No. 10-2019-0043688, filed on Apr. 15, 2019, which is hereby incorporated by reference for all purposes as if fully set forth herein.

BACKGROUND

Field

Exemplary implementations of the invention relate generally to a display device and, more specifically, to a foldable display device.

Discussion of the Background

Electronic products such as smart phones, digital cameras, laptop computers, navigation systems, and smart televisions include a display device for displaying an image to users. The display devices generate an image and provide users with the image displayed on a display screen.

With the advancement of display technology, various type display devices have recently been being developed. A flexible display device has become common and includes a flexible part that can be curvedly deformed, folded, or rolled. The flexible display devices capable of being deformed in various shapes allow for improvement in portability and user's convenience.

The above information disclosed in this Background section is only for understanding of the background of the inventive concepts, and, therefore, it may contain information that does not constitute prior art.

SUMMARY

Display devices constructed according to the principles and exemplary implementations of the invention are capable of being folded along multiple spaced axes regardless of the folding sequence, i.e., which axis is folded first.

According to one or more exemplary embodiments, first and second folding parts may have respective folding portions with first and second radii of curvature capable of being changed based on the folding sequence of a display device. For example, when the first folding part is folded prior to the second folding part, the second folding part has a radius of curvature greater than that of the first folding part, but when the second folding part is folded prior to the first folding part, the first folding part has a radius of curvature greater than that of the second folding part.

Additional features of the inventive concepts will be set forth in the description which follows, and in part will be apparent from the description, or may be learned by practice of the inventive concepts.

According to one aspect of the invention, a display device includes: a display module; and a hinge member coupled to and at least partially overlapping the display module, wherein the hinge member includes: first, second, and third plates which are spaced apart from each other, the first to third plates supporting the display module; a first rotating shaft and a second rotating shaft to rotate the second plate; and a third rotating shaft and a fourth rotating shaft to rotate the third plate, the first and second rotating shafts being disposed between the first plate and the second plate, the third and fourth rotating shafts being disposed between the first plate and the third plate; a first shaft support connected to one end of the first rotating shaft and one end of the second rotating shaft; and a second shaft support connected to other end of the first rotating shaft and other end of the second rotating shaft, the first and second shaft supports supporting at least one of the first and second rotating shafts for limited linear movement; and a third shaft support connected to one end of the third rotating shaft and one end of the fourth rotating shaft; and a fourth shaft support connected to other end of the third rotating shaft and other end of the fourth rotating shaft, the third and fourth shaft supports supporting at least one of the third and fourth rotating shafts for limited linear movement, and wherein at least one of the first and second rotating shafts and at least one of the third and fourth rotating shafts are linearly movable in response to rotation of one of the second and third plates.

The first and second rotating shafts may be spaced from each other at a first distance or a second distance greater than the first distance, and when the third plate rotates to face the first plate, the first and second shafts may be spaced at the second distance.

The third and fourth rotating shafts may be spaced from each other at a first distance or a second distance greater than the first distance, and when the second plate rotates to face the first plate, the third and fourth rotating shafts may be spaced at the second distance.

When the first to third plates are linearly arranged, the first and second rotating shafts may be spaced from each other at the same distance as the distance between the third and fourth rotating shafts.

The first and second shaft supports may include first and second gearboxes, respectively, and the first gearbox may include: a first main gear coupled to the one end of the first rotating shaft; a second main gear coupled to the one end of the second rotating shaft; and a plurality of first sub-gears engaged with each other and one of which is engaged with the second main gear, the number of the first sub-gears being an even number, and wherein the third and fourth shaft supports may include third and fourth gearboxes, respectively, and the third gearbox may include: a third main gear coupled to the one end of the third rotating shaft; a fourth main gear coupled to the one end of the fourth rotating shaft; and a plurality of second sub-gears engaged with each other and one of which is engaged with the fourth main gear, the number of the second sub-gears being an even number.

When the first to third plates have a first position in which they are substantially linearly arranged, the first main gear and the second main gear may be configured to be engaged with each other, and the third main gear and the fourth main gear may be configured to be engaged with each other.

When the second plate is rotatable to face the first plate, the first main gear and the second main gear may be configured to be engaged with each other, and the third main gear and the fourth main gear may be configured to be disengaged from each other.

Two outermost ones of the second sub-gears may be respectively configured to be engaged with the third main gear and the fourth main gear.

When the third plate is rotatable to face the first plate, the third main gear and the fourth main gear may be configured to be engaged with each other, and the first main gear and the second main gear may be configured to be spaced apart from each other.

Two outermost ones of the first sub-gears may be respectively configured to be engaged with the first main gear and the second main gear.

The second gearbox may include: a fifth main gear coupled to the other end of the first rotating shaft; a sixth main gear coupled to the other end of the second rotating shaft; and a plurality of third sub-gears configured to be engaged with each other and with the sixth main gear, the number of the third sub-gears being an even number, and wherein the fourth gearbox may include: a seventh main gear coupled to the other end of the third rotating shaft; an eighth main gear coupled to the other end of the fourth rotating shaft; and a plurality of fourth sub-gears configured to be engaged with each other and with the eighth main gear, the number of the fourth sub-gears being an even number.

The display module may include: first, second, and third parts respectively overlapping the first, second, and third plates; a first folding part between the first flat part and the second flat part; and a second folding part between the first flat part and the third flat part.

The first rotating shaft may be adjacent to one side of the first plate, the second rotating shaft may be adjacent to one side of the second plate, the one side of the second plate facing the one side of the first plate, the third rotating shaft may be adjacent to other side of the first plate, and the fourth rotating shaft may be adjacent to one side of the third plate, the one side of the third plate facing the other side of the first plate.

The display device may further include: a first coupler including: a first supporter having a first through hole through which the first rotating shaft passes; and a second supporter having a second through hole through which the second rotating shaft passes, the first supporter being between the first plate and the first shaft support, the second supporter being between the second plate and the first shaft support; and a second coupler including: a third supporter having a third through hole through which the third rotating shaft passes; and a fourth supporter having a fourth through hole through which the fourth rotating shaft passes, the third supporter being between the first plate and the third shaft support, the fourth supporter being between the third plate and the third shaft support, wherein each of the first and third through holes may have an elongate shape forming part of lost motion connection.

When the third plate is rotatable to face the first plate, the first rotating shaft may be configured to move along the first through hole to approach the first plate.

When the second plate is rotatable to face the first plate, the third rotating shaft may be configured to move along the third through hole to approach the first plate.

The display device may further include: a third coupler including: a fifth supporter having a fifth through hole through which the first rotating shaft passes; and a sixth supporter having a sixth through hole through which the second rotating shaft passes, the fifth supporter being between the first plate and the second shaft support, the sixth supporter being between the second plate and the second shaft support; and a fourth coupler including: a seventh supporter having a seventh through hole through which the third rotating shaft passes; and an eighth supporter having an eighth through hole through which the fourth rotating shaft passes, the seventh supporter being between the first plate and the fourth shaft support, the eighth supporter being between the third plate and the fourth shaft support, wherein each of the fifth and seventh through holes may have an elongate shape forming part of a lost motion connection.

The display device may further include at least one biasing member including one end connected to the first rotating shaft and other end connected to the third rotating shaft, wherein, when the second plate rotates to face the first plate, the first rotating shaft may be biased by the biasing member to allow the third rotating shaft to move closer to the first plate, and wherein, when the third plate rotates to face the first plate, the third rotating shaft may be biased by the biasing member to allow the first rotating shaft to move closer to the first plate.

The biasing member may include a wire is disposed below the first plate.

The display device may further include: a first spring unit between the first plate and the second plate; and a second spring unit between the first plate and the third plate.

According to another aspect of the invention, a method of folding a display device having first, second and third sections, a first folding part disposed between the first and second sections, and a second folding part disposed between the second and third sections, with first and second folding axes being disposed between the first and second sections and third and fourth folding axes being disposed between the second and third sections such that the display device has a first expanded position in which the first, second and third sections are substantially linearly arranged in a common plane and a second compact position in which at least two of the sections overlap each other, the method includes steps of: folding the first section about one of the first and second folding axes to overlap the second section; moving at least one of third and fourth folding axes away from each other in response to the folding of the first section; and folding the third section about one of the third and fourth folding axes to overlap the second section.

The first and second folding axes may be spaced from each other at a first minimum distance and the third and fourth folding axes may be spaced from each other at the first minimum distance in the first expanded position of the display device, and only one of the first and second folding axes or the third and fourth folding axes may be spaced at the first minimum distance in the second compact position of the display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 9A, 9B, and 9C are cross-sectional views of the hinge member of FIG. 7 folded in a second folding operation according to the principles of the invention.

DETAILED DESCRIPTION

Figure 1:
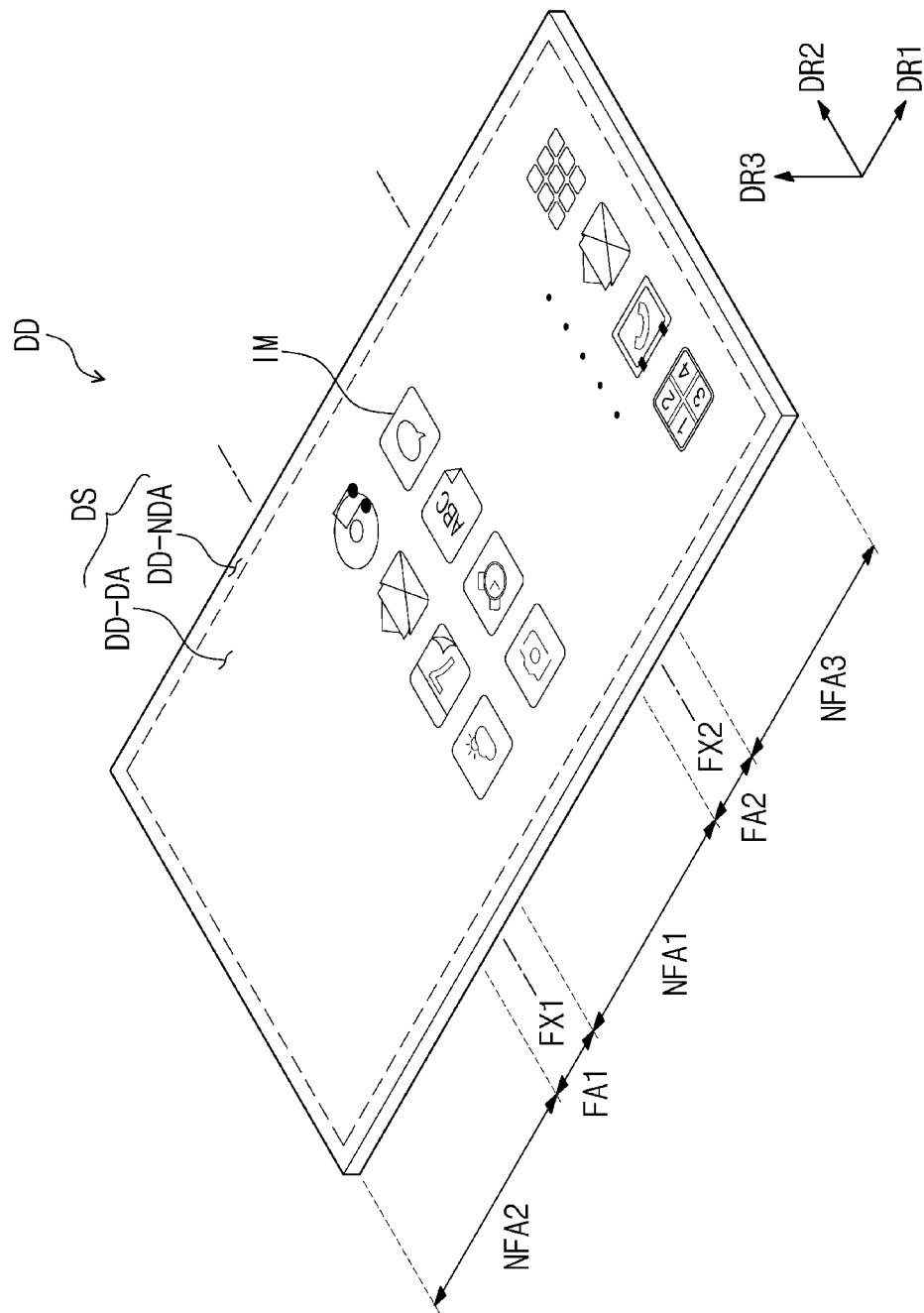
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
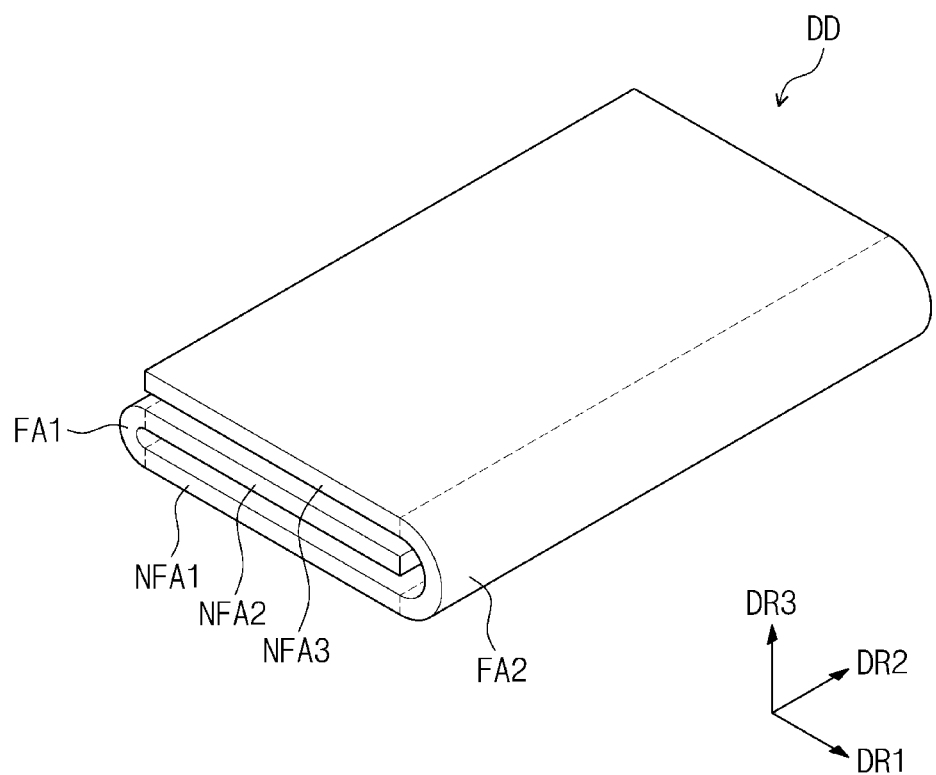
FIG. 2A is a perspective view of the display device of FIG. 1 folded in a first folding operation.
Figure 2B:
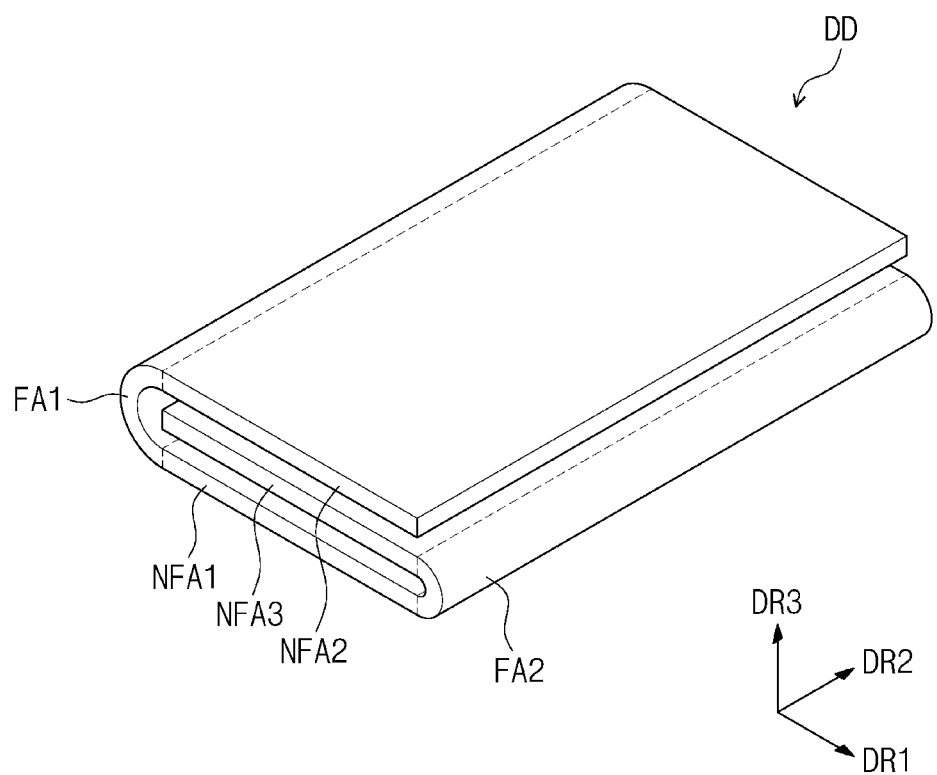
FIG. 2B is a perspective view of the display device folded in a second folding operation.

FIG. 1 is a perspective view of an exemplary embodiment of a display device constructed according to the principles of the invention. FIG. 2A is a perspective view of the display device of FIG. 1 folded in a first folding operation. FIG. 2B is a perspective view of the display device folded in a second folding operation.

Referring to FIG. 1, a display device DD may display an image IM on a display surface DS. Application icons are illustrated as examples of objects included in the image IM. The display surface DS may include a display area DD-DA on which the image IM is displayed and a non-display area DD-NDA adjacent to the display area DD-DA. The non-display area DD-NDA is a region on which no image is displayed.

For example, the non-display area DD-NDA may surround the display area DD-DA. For another example, the non-display area DD-NDA may be disposed adjacent to only a portion of the display area DD-DA, or no non-display area DD-NDA may be provided.

The display surface DS may have a shape extending in a first direction DR1 and in a second direction DR2 intersecting the first direction DR1. A third direction DR3 indicates a normal direction of the display surface DS, or denotes a thickness direction of the display device DD. In this description, the phrase "when viewed in plan or on a plane" may mean "when viewed in the third direction DR3." The third direction DR3 differentiates a front surface (or top surface) and a rear surface (or bottom surface) of each layer or unit which will be discussed below. However, the first to third directions DR1 to DR3 are relative concepts and thus may be changed into other directions, for example, opposite directions.

The display device DD is illustrated to have a rectangular display surface DS, but exemplary embodiments of the display surface are not limited thereto. For example, when viewed on a plane, the display device DD may include a partially rounded display surface or a cubic display surface. The cubic display surface may include a plurality of display regions oriented in different directions or a polygonal pillar-shaped display surface.

The display device DD may be used for a mobile phone terminal. A mobile phone terminal may be configured to include the display device DD in a bracket/case which accommodates a mainboard on which are installed an electronic module, a camera module, a power module, and the like. The display device DD may be applicable not only to large-sized electronic products such as television sets and monitors, but to small and middle-sized electronic products such as tablet PCs, automotive navigation systems, game consoles, and smart watches.

The display device DD may include a flexible material, and may be folded at plural folding parts about their respective folding axes. Hereinafter, an example of a display device DD capable of being folded at two folding parts will be described. However, exemplary embodiments of the display device DD are not limited thereto, and the display device DD may include more folding parts. The display device DD may include a first flat part NFA1, a second flat part NFA2, a third flat part NFA3, a first folding part FA1, and a second folding part FA2. The first flat part NFA1 may be disposed between the second flat part NFA2 and the third flat part NFA3. The first folding part FA1 may be disposed between the first flat part NFA1 and the second flat part NFA2, and the second folding part FA2 may be disposed between the first flat part NFA1 and the third flat part NFA3.

Each of the first to third flat parts NFA1 to NFA3 has a generally flat shape and is not folded. The first folding part FA1 may be folded along a first folding axis FX1, and the second folding part FA2 may be folded along a second folding axis FX2. The second direction DR2 may be the same as a direction of each of the first and second folding axes FX1 and FX2.

For example, the second folding part FA2 may not be folded until the first folding part FA1 is folded. For another example, the first folding part FA1 may not be folded until the second folding part FA2 is folded. In certain embodiments, the display device DD may be configured such that any of the first and second folding parts FA1 and FA2 may be first folded regardless of folding sequence.

A first folding operation of the display device DD is defined hereinafter to indicate a case where the first folding part FA1 is folded prior to the second folding part FA2. Further, a second folding operation of the display device DD is defined hereinafter to indicate a case where the second folding part FA2 is folded prior to the first folding part FA1.

In exemplary embodiments, the folding sequence of the display device DD may change a first radius of curvature of the first folding part FA1 folded along the first folding axis FX1 and/or a second radius of curvature of the second folding part FA2 folded along the second folding axis FX2.

As shown in FIG. 2A, when the first folding operation is performed, the second radius of curvature of the second folding part FA2 may be greater than the first radius of curvature of the first folding part FA1. When the first folding part FA1 is folded prior to the second folding part FA2, the first flat part NFA1 and the second flat part NFA2 may face each other. In this case, the first radius of curvature may be defined by the first folding part FA1 folded along the first folding axis FX1. Afterwards, the second folding part FA2 may be folded to allow the second flat part NFA2 to face the third flat part NFA3. In this case, the second radius of curvature may be defined by the second folding part FA2 folded along the second folding axis FX2.

When the first folding operation is performed, the second radius of curvature of the second folding part FA2 becomes greater than the first radius of curvature of the first folding part FA1. This will be further discussed in detail below.

As shown in FIG. 2B, when the second folding operation is performed, the first radius of curvature of the first folding part FA1 may be greater than the second radius of curvature of the second folding part FA2. Because the second folding part FA2 is folded prior to the first folding part FA1, the first flat part NFA1 and the third flat part NFA3 may face each other. Afterwards, the first folding part FA1 may be folded to allow the third flat part NFA3 to face the first flat part NFA1.

When the second folding operation is performed, the first radius of curvature of the first folding part FA1 becomes greater than the second radius of curvature of the second folding part FA2. This will be further discussed in detail below.

Figure 3:
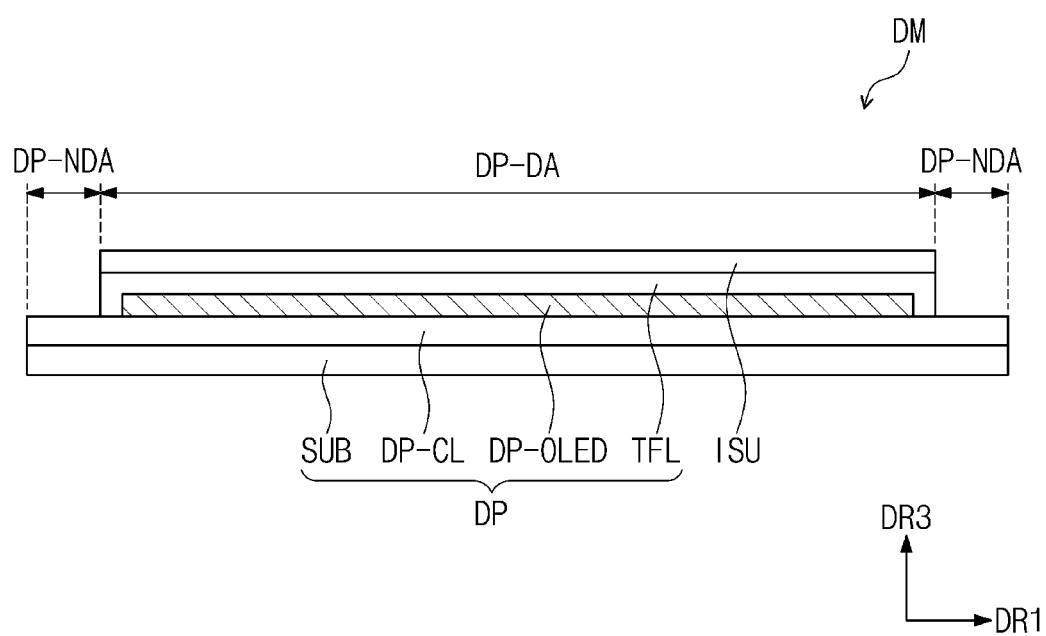
FIG. 3 is a cross-sectional view of an exemplary embodiment of a display module constructed according to the principles of the invention.

FIG. 3 is a cross-sectional view of an exemplary embodiment of a display module constructed according to the principles of the invention.

Referring to FIG. 3, a display module DM may include a display panel DP which displays an image and an input sensing unit ISU which senses an external input. The display panel DP may include a base substrate SUB, a circuit device layer DP-CL, a display device layer DP-OLED, and an encapsulation layer TFL. The display panel DP may include a display area DP-DA and a non-display area DP-NDA. The display area DP-DA and the non-display area DP-NDA of the display panel DP may overlap the display area DD-DA and the non-display area DD-NDA of the display device DD discussed above with reference to FIG. 1.

The base substrate SUB may generally support the input sensing unit ISU and components of the display panel DP, and may include a flexible material. For example, the base substrate SUB may include a plastic substrate, a glass substrate, or an organic-inorganic composite material substrate. Alternatively, the base substrate SUB may be a stack including a plurality of dielectric layers. The plastic substrate may include one or more of acryl-based resin, methacryl-based resin, vinyl-based resin, epoxy-based resin, urethane-based resin, cellulose-based resin, siloxane-based resin, polyimide-based resin, polyamide-based resin, and perylene-based resin.

The circuit device layer DP-CL is disposed on the base substrate SUB. The circuit device layer DP-CL may overlap both the display area DP-DA and the non-display area DP-NDA. The circuit device layer DP-CL may include a plurality of dielectric layers, a plurality of conductive layers, and a semiconductor layer. The plurality of conductive layers included in the circuit device layer DP-CL may constitute signal lines or a pixel control circuit.

The display device layer DP-OLED overlaps the display area DP-DA and lies on the base substrate SUB. The display device layer DP-OLED includes at least one display device, for example, organic light emitting diodes. Exemplary embodiments of the invention, however, are not limited thereto. For example, depending on types of the display panel, the display device layer DP-OLED may include inorganic light emitting diodes or organic-inorganic hybrid light emitting diodes.

The encapsulation layer TFL encapsulates the display device layer DP-OLED. For example, the encapsulation layer TFL may overlap both the display area DP-DA and the non-display area DP-NDA, or may not overlap the non-display area DP-NDA.

In exemplary embodiments, the encapsulation layer TFL may be provided in the form of a thin-film encapsulation layer. The thin-film encapsulation layer protects the display device layer DP-OLED against foreign substances such as moisture, oxygen, and dust particles. The encapsulation layer TFL may include at least one encapsulation organic layer and at least one encapsulation inorganic layer. The encapsulation inorganic layer protects the display device layer DP-OLED against moisture and oxygen, and the encapsulation organic layer protects the display device layer DP-OLED against impurities such as dust particles. The encapsulation inorganic layer may include a silicon nitride layer, a silicon oxynitride layer, a silicon oxide layer, a titanium oxide layer, or an aluminum oxide layer, but exemplary embodiments are not limited thereto. The encapsulation organic layer may include an acryl-based organic layer, but exemplary embodiments are not limited thereto.

The input sensing unit ISU may be directly disposed on the display panel DP. In this description, the phrase "A is directly disposed on B" means that no adhesive layer or other component is disposed between A and B. The input sensing unit ISU and the display panel DP may be successively fabricated.

The input sensing unit ISU may sense an input externally applied thereto. The externally applied input may be provided in various types. For example, the external input includes a part of user's body, a stylus pen, light, heat, pressure, or any of other external inputs. In addition, the external input not only includes a user's touch, but includes an approaching spatial touch (e.g., hovering touch).

Alternatively, the input sensing unit ISU may not be directly disposed on the display panel DP, but instead, an adhesive layer may be placed between the display panel DP and the input sensing unit ISU. In other exemplary embodiments, the input sensing unit ISU may be omitted. In this case, the display module DM includes only the display panel DP.

Figure 4:
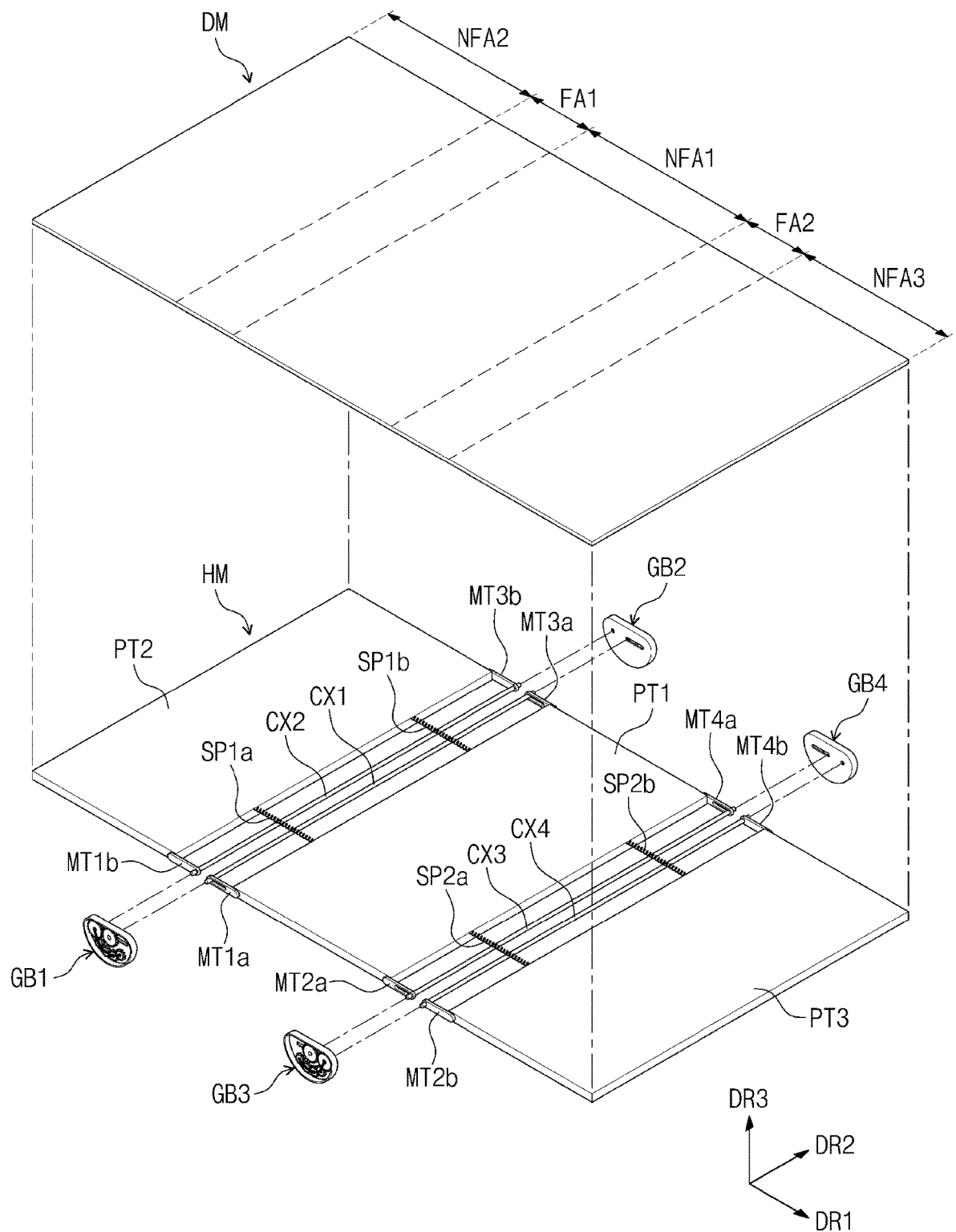
FIG. 4 is an exploded perspective view of a display device constructed according to the principles of the invention.
Figure 5:
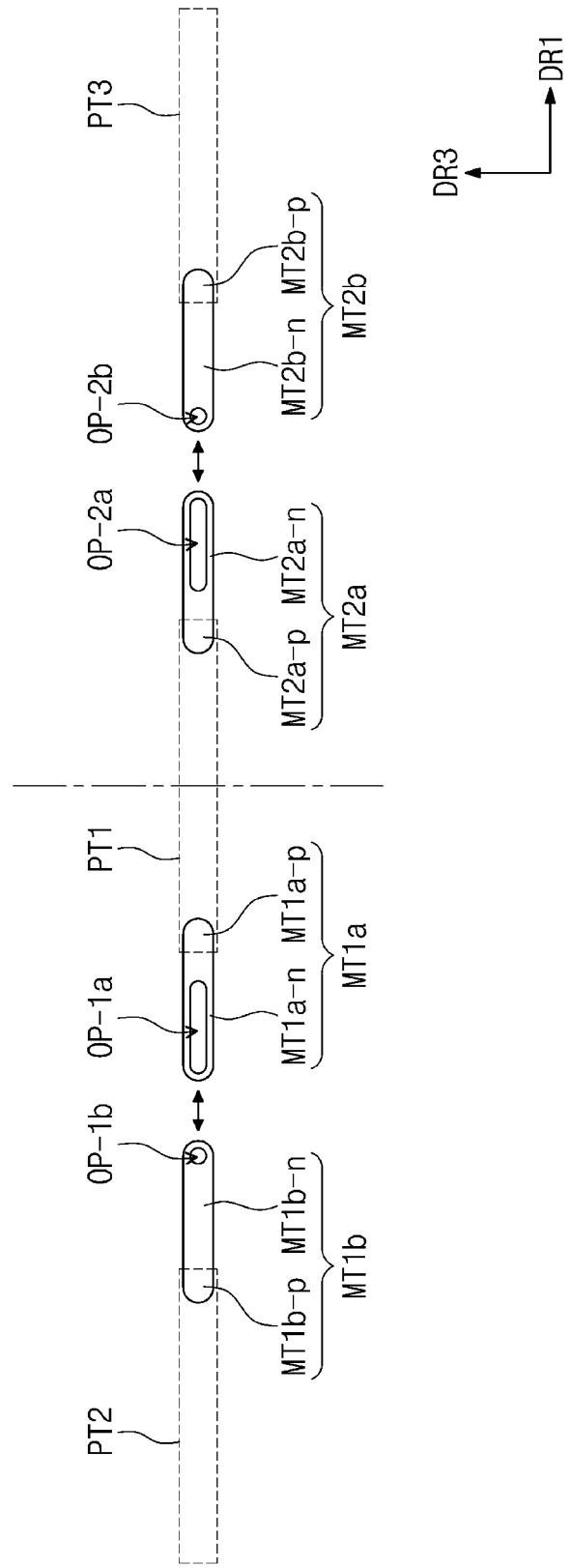
FIG. 5 is a cross-sectional view of an exemplary embodiment of the couplers of FIG. 4.
Figure 6A:
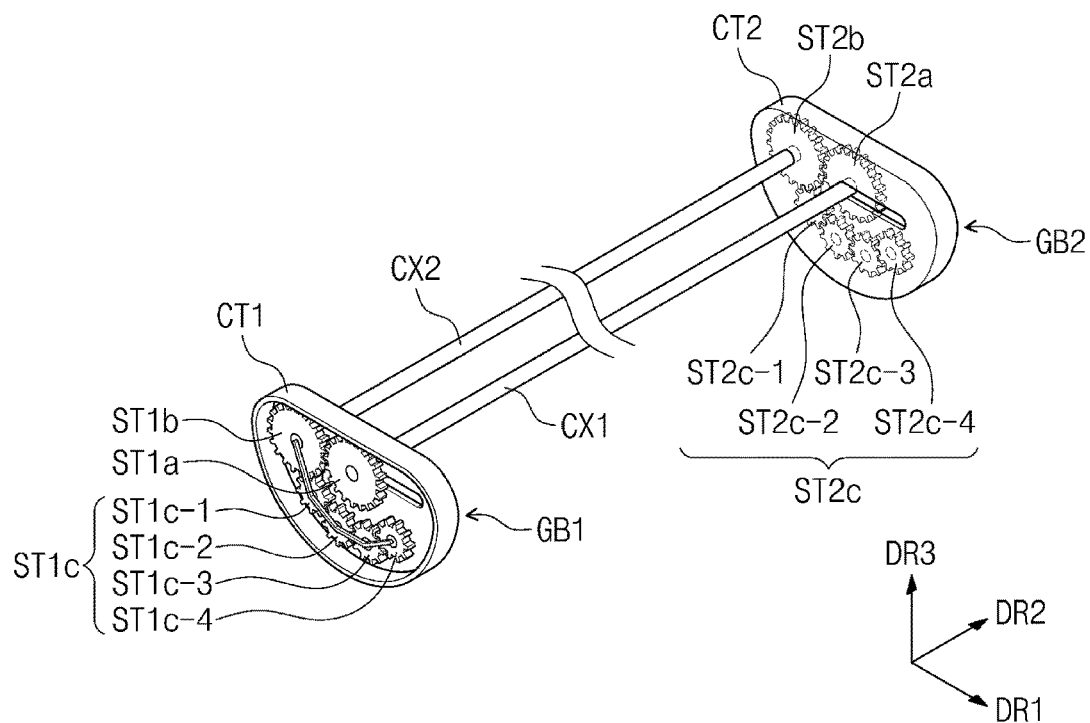
FIG. 6A is a perspective view of an exemplary embodiment of the first gearbox and the second gearbox connected through the first and second rotating shafts of FIG. 4.
Figure 6B:
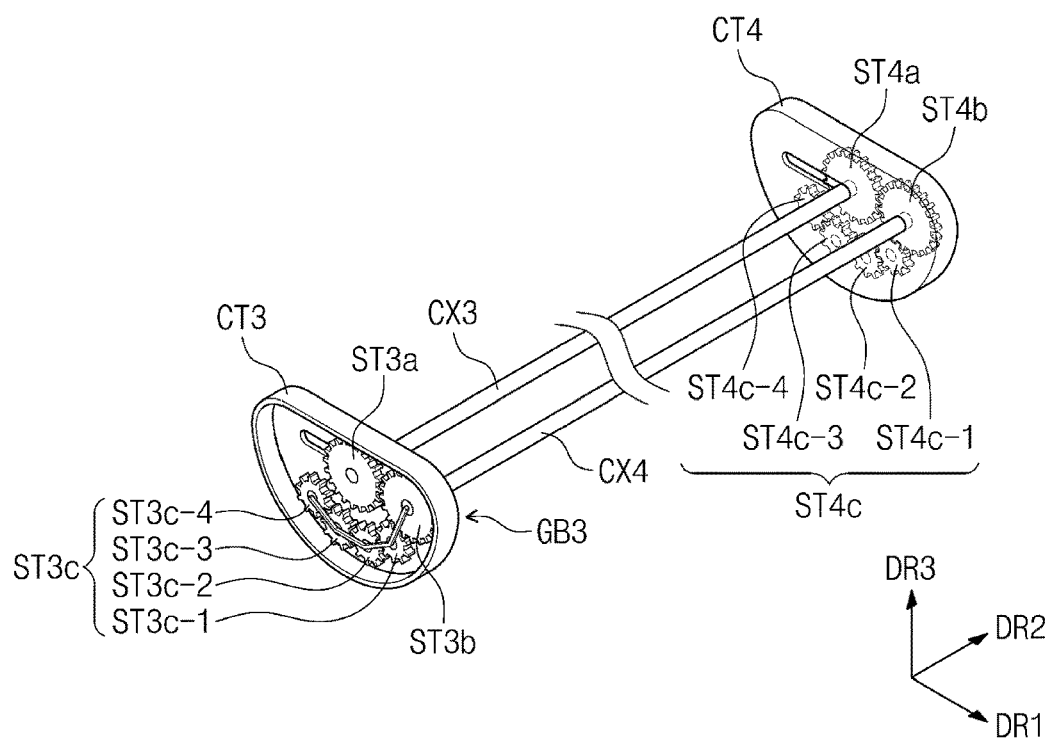
FIG. 6B is a perspective view of an exemplary embodiment of the third gearbox and the fourth gearbox connected through the third and fourth rotating shafts of FIG. 4.

FIG. 4 is an exploded perspective view of a display device constructed according to the principles of the invention. FIG. 5 is a cross-sectional view of an exemplary embodiment of the couplers of FIG. 4. FIG. 6A is a perspective view of an exemplary embodiment of the first gearbox and the second gearbox connected through the first and second rotating shafts of FIG. 4. FIG. 6B is a perspective view of an exemplary embodiment of the third gearbox and the fourth gearbox connected through the third and fourth rotating shafts of FIG. 4.

Referring to FIG. 4, the display device DD includes a hinge member HM and the display module DM which is shown in FIG. 3. The display module DM may be associated with the hinge member HM. The hinge member HM may control the first and second folding operations of the display device DD discussed above with reference to FIGS. 2A and 2B.

The hinge member HM may include a supporting unit which supports the display module DM, a rotating unit, a coupling unit, a first gear group, a second gear group, and a spring unit.

The supporting unit includes first, second, and third plates PT1, PT2, and PT3 which respectively support the first, second, and third flat parts NFA1, NFA2, and NFA3 of the display module DM. The first, second, and third plates PT1, PT2, and PT3 may include a substantially rigid material. The first plate PT1 is disposed between the second and third plates PT2 and PT3 and overlaps the first flat area NFA1, the second plate PT2 overlaps the second flat area NFA2, and the third plate PT3 overlaps the third flat part NFA3.

In exemplary embodiments, the second plate PT2 may be disposed above the first plate PT1 or the third plate PT3, along the first radius of curvature of the first folding part FA1. The third plate PT3 may be disposed above the first plate PT1 or the second plate PT2, along the second radius of curvature of the second folding part FA2.

For example, when the first folding operation is performed as shown in FIG. 2A, the second plate PT2 is disposed on the first plate PT1, and the third plate PT3 is disposed on the second plate PT2. When the second folding operation is performed as shown in FIG. 2B, the third plate PT3 is disposed on the first plate PT1, and the second plate PT2 is disposed on the third plate PT3.

The rotating unit includes a first rotating shaft CX1 and a second rotating shaft CX2 which overlap the first folding part FA1, and also includes a third rotating shaft CX3 and a fourth rotating shaft CX4 which overlap the second folding part FA2. Each of the first to fourth rotating shafts CX1 to CX4 may have a shape which extends longitudinally along the second direction DR2 the same as the direction of either the first folding axis FX1 or the second folding axis FX2 shown in FIG. 1. For example, each of the first to fourth rotating shafts CX1 to CX4 may be provided in a circular cylindrical shape.

The first rotating shaft CX1 is adjacent in the first direction DR1 to one side of the first plate PT1, and the second rotating shaft CX2 is adjacent in the first direction DR1 to one side of the second plate PT2 facing the one side of the first plate PT1. The third rotating shaft CX3 is adjacent in the first direction DR1 to other side of the first plate PT1, and the fourth rotating shaft CX4 is adjacent in the first direction DR1 to one side of the third plate PT3 facing the other side of the first plate PT1. As described in more detailed below, at least one of the first and second rotating shafts CX1 and CX2 and at least one of the third and fourth rotating shafts CX3 and CX4 are coupled to the first to third plates PT1 to PT3 to permit limited motion relative the plates in the first direction DR1 in response to a rotation of one of the second and third plates PT2 and PT3.

The spring unit may be disposed between the first to third plates PT1 to PT3. For example, the spring unit includes two first springs SP1a and SP1b which are spaced apart from each other between the first plate PT1 and the second plate PT2. Each of the first springs SP1a and SP1b may have one end connected to the first plate PT1 and other end connected to the second plate PT2. In addition, the spring unit includes two second springs SP2a and SP2b which are spaced apart from each other between the first plate PT1 and the third plate PT3. Each of the second springs SP2a and SP2b may have one end connected to the first plate PT1 and other end connected to the third plate PT3.

In this description, two springs are disposed between two adjacent plates, but alternatively one spring may be disposed between two adjacent plates.

The coupling unit includes first to fourth couplers which are coupled to the first to fourth rotating shafts CX1 to CX4 and the gear groups. The following will describe the first to fourth couplers in detail with reference to FIGS. 4 and 5.

The first coupler includes a first supporter MT1a between a first gearbox GB1 and one side of the first plate PT1 as seen in the second direction DR2, and also includes a second supporter MT1b between the first gearbox GB1 and one side of the second plate PT2 as seen in the second direction DR2.

The first supporter MT1a includes a first segment MT1a-p which is fixed to the one side of the first plate PT1 and a second segment MT1a-n which does not overlap the first plate PT1 when viewed in the second direction DR2. The second segment MT1a-n of the first supporter MT1a may include a first through hole OP-1a through which one end of the first rotating shaft CX1 passes.

The second supporter MT1b includes a first segment MT1b-p which is fixed to the one side of the second plate PT2 and a second segment MT1b-n which does not overlap the second plate PT2 when viewed in the second direction DR2. The second segment MT1b-n of the second supporter MT1b may include a second through hole OP-1b through which one end of the second rotating shaft CX2 passes.

In exemplary embodiments, the first through hole OP-1a and the second through hole OP-1b may be provided in different shapes from each other. For example, the first through hole OP-1a may have an elongate shape extending in the first direction DR1, and the second through hole OP-1b may have a circular shape corresponding to that of the second rotating shaft CX2. Therefore, the first rotating shaft CX1 may move along the first direction DR1 within the first through hole OP-1a. As such, each coupler includes an opening such as the first through hole OP-1a extending in the first direction to enable a corresponding rotating shaft to move a limited amount between the ends of the opening. The limited motion afforded by this structure is an example of a lost motion connection. Other types of lost motion connections may be employed to achieve the same type of limited motion described herein.

The second coupler includes a third supporter MT2a between a third gearbox GB3 and the one side of the first plate PT1 as seen in the second direction DR2, and also includes a fourth supporter MT2b between the third gearbox GB3 and one side of the third plate PT3 as seen in the second direction DR2.

The third supporter MT2a includes a first segment MT2a-p which is fixed to the one side of the first plate PT1 and a second segment MT2a-n which does not overlap the first plate PT1 when viewed in the second direction DR2. The second segment MT2a-n of the third supporter MT2a may include a third through hole OP-2a through which one end of the third rotating shaft CX3 passes. The third through hole OP-2a may be provided in the same shape as that of the first through hole OP-1a.

The fourth supporter MT2b includes a first segment MT2b-p which is fixed to the one side of the third plate PT3 and a second segment MT2b-n which does not overlap the third plate PT3 when viewed in the second direction DR2. The second segment MT2b-n of the fourth supporter MT2b may include a fourth through hole OP-2b through which one end of the fourth rotating shaft CX4 passes. The fourth through hole OP-2b may be provided in the same shape as that of the second through hole OP-1b.

In exemplary embodiments, the third through hole OP-2a and the fourth through hole OP-2b may be provided in different shapes from each other. For example, the third through hole OP-2a may have an elongate shape extending in the first direction DR1, and the fourth through hole OP-2b may have a circular shape corresponding to that of the fourth rotating shaft CX4. Therefore, the third rotating shaft CX3 may move along the first direction DR1 within the third through hole OP-2a. In another exemplary embodiment, the third supporter MT2a includes a through hole having a circular shape such as the fourth through hole OP-2b, and the fourth supporter MT2b includes an elongate through hole extending in the first direction DR1 such as the third through hole OP-2a. Also, the first supporter MT1a may include a through hole having a circular shape such as the second through hole OP-1b, and the second supporter MT1b may include an elongate through hole extending in the first direction DR1 such as the first through hole OP-1a. In this manner, second rotating shaft CX2 that is received in the through hole of the second supporter MT1b may move a limited amount along the first direction DR1, and the fourth rotating shaft CX4 that is received in the through hole of the fourth supporter MT2b may move a limited amount along the first direction DR1.

Moreover, as shown in FIG. 4, the coupling unit includes the third coupler and the fourth coupler.

The third coupler includes a fifth supporter MT3a between a second gearbox GB2 and other side of the first plate PT1 as seen in the second direction DR2, and also includes a sixth supporter MT3b between the second gearbox GB2 and other side of the second plate PT2 as seen in the second direction DR2.

The fifth supporter MT3a may be provided in a shape corresponding to that of the first supporter MT1a. For example, the fifth supporter MT3a may include a fifth through hole through which other end of the first rotating shaft CX1 passes. The fifth through hole has a shape corresponding to that of the first through hole OP-1a. As a result, the first rotating shaft CX1 may move a limited amount along the first direction DR1 within the first through hole OP-1a and the fifth through hole.

The sixth supporter MT3b may be provided in a shape corresponding to that of the second supporter MT1b. The sixth supporter MT3b may include a sixth through hole through which other end of the second rotating shaft CX2 passes. The sixth through hole has a shape corresponding to that of the second through hole OP-1b.

The fourth coupler includes a seventh supporter MT4a between a fourth gearbox GB4 and the other side of the first plate PT1 as seen in the second direction DR2, and also includes an eighth supporter MT4b between the fourth gearbox GB4 and other side of the third plate PT3 as seen in the second direction DR2.

The seventh supporter MT4a may be provided in a shape corresponding to that of the third supporter MT2a. For example, the seventh supporter MT4a may include a seventh through hole through which the other end of the third rotating shaft CX3 passes. The seventh through hole has a shape corresponding to that of the third through hole OP-2a. As a result, the third rotating shaft CX3 may move a limited amount along the first direction DR1 within the third through hole OP-2a and the seventh through hole.

The eighth supporter MT4b may be provided in a shape corresponding to that of the fourth supporter MT2b. The eighth supporter MT4b may include an eighth through hole through which other end of the fourth rotating shaft CX4 passes. The eighth through hole has a shape corresponding to that of the fourth through hole OP-2b.

Referring back to FIG. 4, the first gear group includes a first shaft support and a second shaft support such as the first gearbox GB1 and the second gearbox GB2 which face each other in the second direction DR2. Each of the first and second rotating shafts CX1 and CX2 may be disposed between the first gearbox GB1 and the second gearbox GB2. The second gear group includes a third shaft support and a fourth shaft support such as the third gearbox GB3 and the fourth gearbox GB4 which face each other in the second direction DR2. Each of the third and fourth rotating shafts CX3 and CX4 may be disposed between the third gearbox GB3 and the fourth gearbox GB4. As described in more detailed below, the first and second shaft supports may support at least one of the first and second rotating shafts CX1 and CX2 for limited linear movement, and the third and fourth shaft supports may support at least one of the third and fourth rotating shafts CX3 and CX4 for limited linear movement.

The first gearbox GB1 may be connected to the one end of the first rotating shaft CX1 passing through the first supporter MT1a and to the one end of the second rotating shaft CX2 passing through the second supporter MT1b. The second gearbox GB2 may be connected to the other end of the first rotating shaft CX1 passing through the fifth supporter MT3a and to the other end of the second rotating shaft CX2 passing through the sixth supporter MT3b.

Referring to FIG. 6A, the first gearbox GB1 includes a first cover CT1, a first gear ST1a, a second gear ST1b, and first connecting gears ST1c. In this description, the first gear ST1a and the second gear ST1b may also be called a first main gear and a second main gear, respectively. Moreover, the first connecting gears ST1c may also be called first sub-gears. In this description, the term "gear" means "toothed gear," but exemplary embodiments are not limited thereto.

The first cover CT1 accommodates the first gear ST1a, the second gear ST1b, and the first connecting gears ST1c. The first cover CT1 may include a first coupling hole through which the first gear ST1a is connected to the first rotating shaft CX1, and also include a second coupling hole through which the second gear ST1b is connected to the second rotating shaft CX2. In exemplary embodiments, the first coupling hole extends in the first direction DR1 such that the first gear ST1a and the first rotating shaft CX1 can move a limited amount along the first direction DR1. The first coupling hole the second coupling hole may have shapes corresponding to those of the first through hole OP-1a and the second through hole OP-1b of the first supporter MT1a and the second supporter MT1b shown in FIG. 5. As such, each gearbox includes an opening such as the first coupling hole extending in the first direction to enable a corresponding rotating shaft to move a limited amount along the opening.

The first gear ST1a is connected through the first coupling hole to the one end of the first rotating shaft CX1, and the second gear ST1b is connected through the second coupling hole to the one end of the second rotating shaft CX2. The first connecting gears ST1c are provided in an even number. For example, the first connecting gears ST1c include four first connecting gears ST1c-1, ST1c-2, ST1c-3, and ST1c-4. One of the four first connecting gears ST1c-1, ST1c-2, ST1c-3, and ST1c-4 is engaged with the second gear ST1b. The number of the first connecting gears ST1c is four, but the exemplary embodiments are not limited thereto.

The second gearbox GB2 includes a second cover CT2, a third gear ST2a, a fourth gear ST2b, and second connecting gears ST2c. In this description, the third gear ST2a and the fourth gear ST2b may also be called a fifth main gear and a sixth main gear, respectively. Moreover, the second connecting gears ST2c may also be called third sub-gears.

The second cover CT2 accommodates the third gear ST2a, the fourth gear ST2b, and the second connecting gears ST2c. The second cover CT2 may include a third coupling hole through which the third gear ST2a is connected to the first rotating shaft CX1, and also include a fourth coupling hole through which the fourth gear ST2b is connected to the second rotating shaft CX2. In exemplary embodiments, the third coupling hole extends in the first direction DR1 such that the third gear ST2a and the first rotating shaft CX1 can move a limited amount along the first direction DR1. The third coupling hole and the fourth coupling hole may have shapes corresponding to those of the fifth through hole and the sixth through hole of the fifth supporter MT3a and the sixth supporter MT3b shown in FIG. 4.

The third gear ST2a is connected through the third coupling hole to the other end of the first rotating shaft CX1, and the fourth gear ST2b is connected through the fourth coupling hole to the other end of the second rotating shaft CX2. The second connecting gears ST2c are provided in an even number. For example, the second connecting gears ST2c include fourth second connecting gears ST2c-1, ST2c-2, ST2c-3, and ST2c-4. One of the four second connecting gears ST2c-1, ST2c-2, ST2c-3, and ST2c-4 is engaged with the fourth gear ST2b. The number of the second connecting gears ST2c is four, but the exemplary embodiments are not limited thereto.

The first and second gears ST1a and ST1b of the first gearbox GB1 may be engaged with or disengaged from each other based on whether the display device DD is folded or not. Similarly, the third and fourth gears ST2a and ST2b of the second gearbox GB2 may be engaged with or disengaged from each other based on whether the display device DD is folded or not.

In exemplary embodiments, when the second plate PT2 rotates to face the first plate PT1 discussed above, the first gear ST1a and the second gear ST1b may be engaged with each other. For example, the first gear ST1a may be engaged with the second gear ST1b due to the tensile force of the first springs SP1a and SP1b when the second plate PT2 is arranged flat with the first plate PT1, and the first gear ST1a may be kept engaged with the second gear ST1b while the second plate PT2 rotates. For example, the case where the second plate PT2 rotates to lie on the first plate PT1 corresponds to the first folding operation discussed above with reference to FIG. 2A. In this case, the first connecting gears ST1c are engaged with only the second gear ST1b and disengaged from the first gear ST1a. Similarly, when the first folding operation is performed, the third gear ST2a and the fourth gear ST2b may be engaged with each other. In this case, the second connecting gears ST2c are engaged with only the fourth gear ST2b and disengaged from the third gear ST2a.

When the third plate PT3 rotates to face the first plate PT1 while the second plate PT2 is disposed flat with the first plate PT1, the first gear ST1a and the second gear ST1b may be disengaged from each other. For example, the case where the third plate PT3 rotates to lie on the first plate PT1 corresponds to the second folding operation discussed above with reference to FIG. 2B. The first gear ST1a moves along the first direction DR1, such that the first gear ST1a and the second gear ST1b are disengaged from each other. In this case, the first gear ST1a moves along the first direction DR1 to approach the first plate PT1. As a result, among the first connecting gears ST1c-1, ST1c-2, ST1c-3, and ST1c-4, two outermost connecting gears ST1c-1 and ST1c-4 are respectively engaged with the second gear ST1b and the first gear ST1a.

Similarly, when the second folding operation is performed, the third gear ST2a and the fourth gear ST2b may be disengaged from each other. The third gear ST2a moves along the first direction DR1, such that the third gear ST2a and the fourth gear ST2b are disengaged from each other. As a result, among the second connecting gears ST2c-1, ST2c-2, ST2c-3, and ST2c-4, two outermost connecting gears ST2c-1 and ST2c-4 are respectively engaged with the fourth gear ST2b and the third gear ST2a. The display device DD may include various electronic and/or mechanical mechanisms that move the first gear ST1a and the third gear ST2a along the first direction DR1 when the third plate PT3 rotates first. Alternatively, the display device DD may include other components that move the first rotating shaft CX1 along the first direction DR1 to be positioned closer to the first plate PT1 when the third plate PT3 rotates. One of the mechanisms will be described with reference to FIG. 10.

In exemplary embodiments, the movement of the first gear ST1a and the third gear ST2a during the second folding operation may drive the first rotating shaft CX1 to shift in the first direction DR1. The first rotating shaft CX1 may approach the one side of the first plate PT1, while shifting along the first through hole OP-1a of the first supporter MT1a, the first coupling hole of the first cover CT1, the fifth through hole of the fifth supporter MT3a, and the third coupling hole of the second cover CT2.

As a result, a first shortest distance between the first rotating shaft CX1 and the second rotating shaft CX2 may increase. The increase in the first shortest distance between the first rotating shaft CX1 and the second rotating shaft CX2 may increase a rotational radius of the second plate PT2 of the supporting unit. In this case, as discussed with reference to FIG. 2B, the first radius of curvature of the first folding part FA1 may become greater than the second radius of curvature of the second folding part FA2.

Referring to FIG. 6B, the third gearbox GB3 includes a third cover CT3, a fifth gear ST3a, a sixth gear ST3b, and third connecting gears ST3c. In this description, the fifth gear ST3a and the sixth gear ST3b may also be called a third main gear and a fourth main gear, respectively. Moreover, the third connecting gears ST3c may also be called second sub-gears.

The third cover CT3 accommodates the fifth gear ST3a, the sixth gear ST3b, and the third connecting gears ST3c. The third cover CT3 may include a fifth coupling hole through which the fifth gear ST3a is connected to the third rotating shaft CX3, and also include a sixth coupling hole through which the sixth gear ST3b is connected to the fourth rotating shaft CX4. The fifth coupling hole extends in the first direction DR1 such that the fifth gear ST3a and the third rotating shaft CX3 can move a limited amount along the first direction DR1. The fifth coupling hole and the sixth coupling hole may have shapes corresponding to those of the third through hole OP-2a and the fourth through hole OP-2b of the third supporter MT2a and the fourth supporter MT2b shown in FIG. 5.

The fifth gear ST3a is connected through the fifth coupling hole to the one end of the third rotating shaft CX3, and the sixth gear ST3b is connected through the sixth coupling hole to the one end of the fourth rotating shaft CX4. The third connecting gears ST3c are provided in an even number. For example, the third connecting gears ST3c include four third connecting gears ST3c-1, ST3c-2, ST3c-3, and ST3c-4. One of the four third connecting gears ST3c-1, ST3c-2, ST3c-3, and ST3c-4 is engaged with the sixth gear ST3b.

The fourth gearbox GB4 includes a fourth cover CT4, a seventh gear ST4a, an eighth gear ST4b, and fourth connecting gears ST4c. In this description, the seventh gear ST4a and the eighth gear ST4b may also be called a seventh main gear and an eighth main gear, respectively. Moreover, the fourth connecting gears ST4c may also be called fourth sub-gears.

The fourth cover CT4 accommodates the seventh gear ST4a, the eighth gear ST4b, and the fourth connecting gears ST4c. The fourth cover CT4 may include a seventh coupling hole through which the seventh gear ST4a is connected to the third rotating shaft CX3, and also include an eighth coupling hole through which the eighth gear ST4b is connected to the fourth rotating shaft CX4. The seventh coupling hole extends in the first direction DR1 such that the seventh gear ST4a and the third rotating shaft CX3 can move a limited amount along the first direction DR1. The seventh coupling hole and the eighth coupling hole may have shapes corresponding to those of the seventh through hole and the eighth through hole of the seventh supporter MT4a and the eighth supporter MT4b shown in FIG. 4.

The seventh gear ST4a is connected through the seventh coupling hole to the other end of the third rotating shaft CX3, and the eighth gear ST4b is connected through the eighth coupling hole to the other end of the fourth rotating shaft CX4. The fourth connecting gears ST4c are provided in an even number. For example, the fourth connecting gears ST4c include four fourth connecting gears ST4c-1, ST4c-2, ST4c-3, and ST4c-4. One of the four fourth connecting gears ST4c-1, ST4c-2, ST4c-3, and ST4c-4 is engaged with the eighth gear ST4b.

In exemplary embodiments, the fifth and sixth gears ST3a and ST3b of the third gearbox GB3 may be engaged with or disengaged from each other based on whether the display device DD is folded or not. Similarly, the seventh and eighth gears ST4a and ST4b of the fourth gearbox GB4 may be engaged with or disengaged from each other based on whether the display device DD is folded or not.

For example, during the second folding operation in which the third plate PT3 rotates first, the fifth gear ST3a and the sixth gear ST3b may be engaged with each other. For example, the fifth gear ST3a may be engaged with the sixth gear ST3b due to the tensile force of the second springs SP2a and SP2b when the third plate PT3 is arranged flat with the first plate PT1, and the fifth gear ST3a may be kept engaged with the sixth gear ST3b while the third plate PT3 rotates. In this case, the third connecting gears ST3c are engaged with only the sixth gear ST3b and disengaged from the fifth gear ST3a. Similarly, during the second folding operation, the seventh gear ST4a and the eighth gear ST4b may be engaged with each other. In this case, the fourth connecting gears ST4c are engaged with only the eighth gear ST4b and disengaged from the seventh gear ST4a.

As discussed in FIG. 6A, when the second folding operation is performed, the first gear ST1a and the second gear ST1b are disengaged from each other in the first gearbox GB1, and the third gear ST2a and the fourth gear ST2b are disengaged from each other in the second gearbox GB2. In addition, as discussed above, when the second folding operation is performed, the fifth gear ST3a and the sixth gear ST3b are engaged with each other in the third gearbox GB3, and the seventh gear ST4a and the eighth gear ST4b are engaged with each other in the fourth gearbox GB4.

Accordingly, when the second folding operation is performed, a second shortest distance between the third rotating shaft CX3 and the fourth rotating shaft CX4 is maintained, and the first shortest distance between the first rotating shaft CX1 and the second rotating shaft CX2 increases.

During the first folding operation in which the second plate PT2 rotates first, the fifth gear ST3a and the sixth gear ST3b may be disengaged from each other. The fifth gear ST3a moves along the first direction DR1, such that the fifth gear ST3a and the sixth gear ST3b are disengaged from each other. In this case, the fifth gear ST3a moves along the first direction DR1 to approach the first plate PT1. A specific direction discussed in this description may include a direction reverse to the specific direction. As a result, among the third connecting gears ST3c-1, ST3c-2, ST3c-3, and ST3c-4, two outermost connecting gears ST3c-1 and ST3c-4 are respectively engaged with the sixth gear ST3b and the fifth gear ST3a.

Similarly, when the first folding operation is performed, the seventh gear ST4a and the eighth gear ST4b may be disengaged from each other. The seventh gear ST4a moves along the first direction DR1, such that the seventh gear ST4a and the eighth gear ST4b are disengaged from each other. As a result, among the fourth connecting gears ST4c-1, ST4c-2, ST4c-3, and ST4c-4, two outermost connecting gears ST4c-1 and ST4c-4 are respectively engaged with the eighth gear ST4b and the seventh gear ST4a. The display device DD may include mechanisms that move the fifth gear ST3a and the seventh gear ST4a along the first direction DR1 when the second plate PT2 rotates first. Alternatively, the display device DD may include other components that move the third rotating shaft CX3 along the first direction DR1 to be positioned closer to the first plate PT1 when the second plate PT2 rotates.

As discussed in FIG. 6A, when the first folding operation is performed, the first gear ST1a and the second gear ST1b are engaged with each other in the first gearbox GB1, and the third gear ST2a and the fourth gear ST2b are engaged with each other in the second gearbox GB2. Further, as discussed above, the movement of the fifth gear ST3a and the seventh gear ST4a during the first folding operation may drive the third rotating shaft CX3 to shift the first direction DR1.

Accordingly, when the first folding operation is performed, the first shortest distance between the first rotating shaft CX1 and the second rotating shaft CX2 is maintained, and the second shortest distance between the third rotating shaft CX3 and the fourth rotating shaft CX4 increases. The increase in the second shortest distance between the third rotating shaft CX3 and the fourth rotating shaft CX4 may increase a rotational radius of the third plate PT3 of the supporting unit. In this case, as discussed with reference to FIG. 2A, the second radius of curvature of the second folding part FA2 may become greater than the first radius of curvature of the first folding part FA1.

Figure 7:
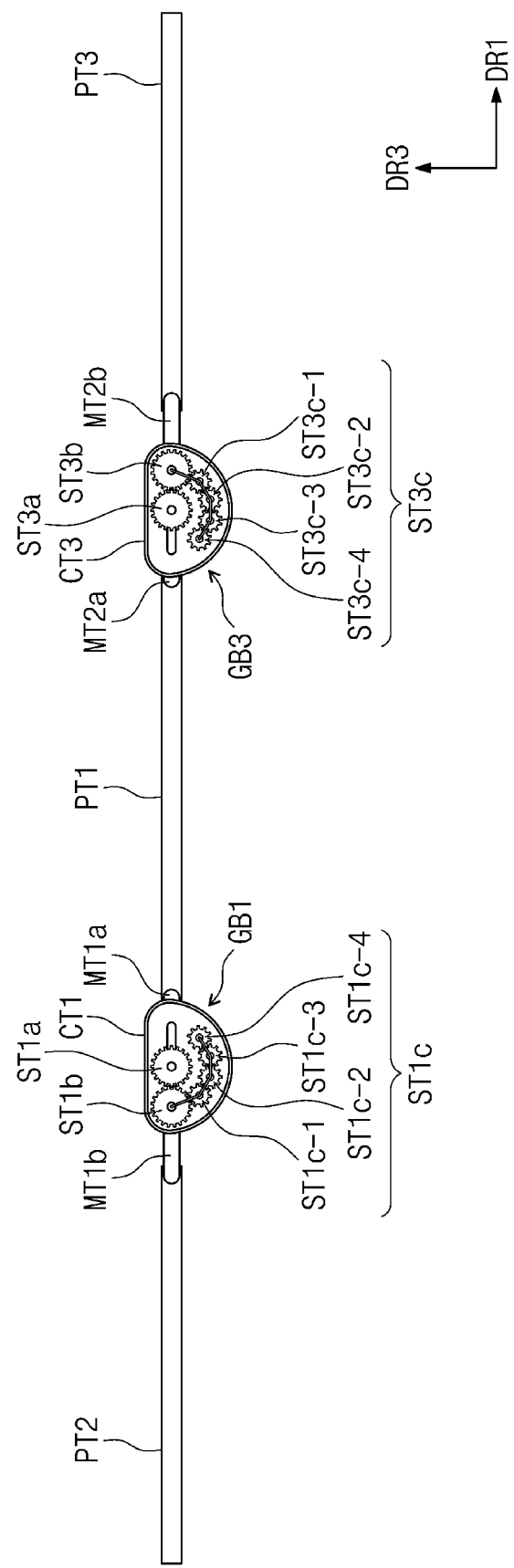
FIG. 7 is a cross-sectional view of an exemplary embodiment of the hinge member of FIG. 4.
Figure 8A:
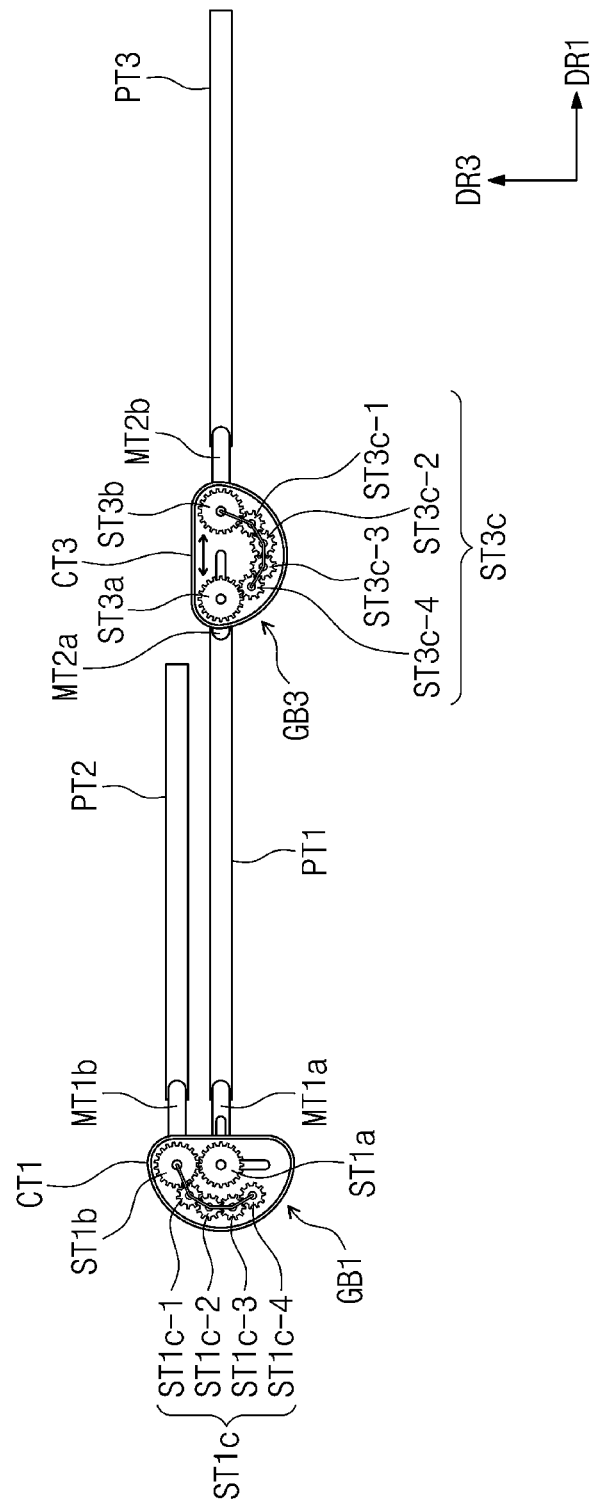
FIGS. 8A, 8B, and 8C are cross-sectional views of the hinge member of FIG. 7 folded in a first folding operation according to the principles of the invention.
Figure 8B:
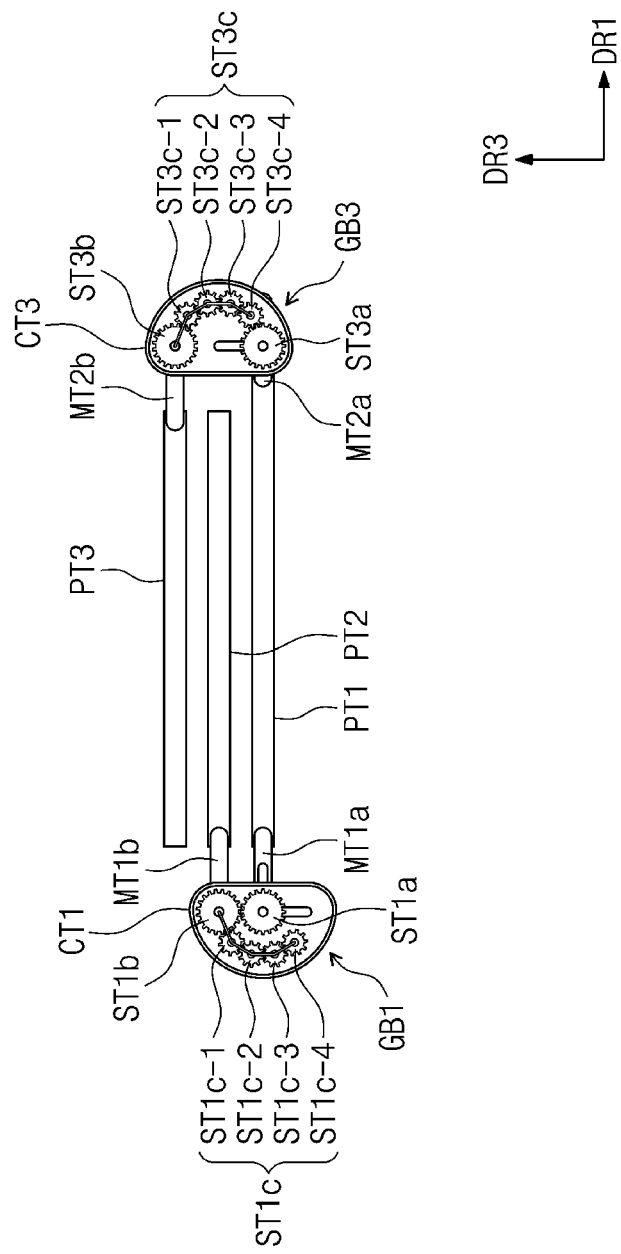
Figure 8C:
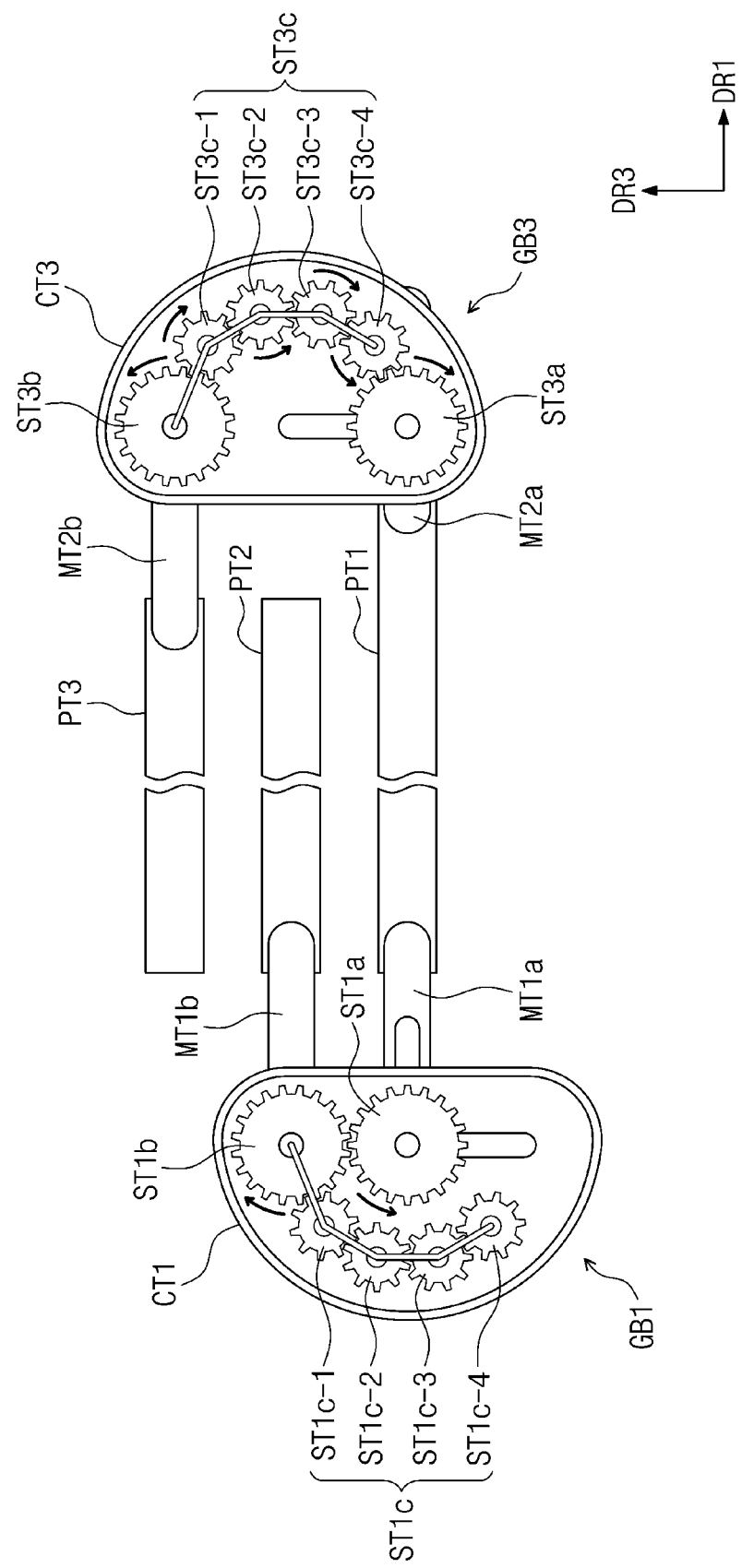

FIG. 7 is a cross-sectional view of an exemplary embodiment of the hinge member of FIG. 4. FIGS. 8A, 8B, and 8C are cross-sectional views of the hinge member of FIG. 7 folded in a first folding operation according to the principles of the invention.

Referring to FIG. 7, it is shown that the first to third plates PT1 to PT3 are substantially parallel to each other or are linearly arranged. For example, the case where the first to third plates PT1 to PT2 are substantially parallel to each other or are linearly arranged may indicate that the display device DD is in a non-folded state. Accordingly, the first to third flat parts NFA1 to NFA3 and the first and second folding parts FA1 and FA2 of the display device DD may have a position in which they are generally linearly arranged in substantially the same plane.

When the display device DD is in the non-folded state, the first gear ST1a and the second gear ST1b are engaged with each other in the first gearbox GB1, and the third gear ST2a and the fourth gear ST2b are engaged with each other in the second gearbox (see GB2 of FIG. 6A). When the display device DD is in the non-folded state, the fifth gear ST3a and the sixth gear ST3b are engaged with each other in the third gearbox GB3, and the seventh gear ST4a and the eighth gear ST4b are engaged with each other in the fourth gearbox (see GB4 of FIG. 6B).

Further, when the display device DD is in the non-folded state, the first shortest distance between the first rotating shaft CX1 and the second rotating shaft CX2 may be the same as the second shortest distance between the third rotating shaft CX3 and the fourth rotating shaft CX4.

With reference to FIGS. 8A to 8C, the following will discuss the first folding operation where the second plate PT2 moves onto the first plate PT1. The display device DD may be configured such that the first folding part FA1 may be folded at the first radius of curvature in the first folding operation which causes the second plate PT2 to face the first plate PT1.

Referring to FIGS. 6A and 8A, the second plate PT2 may rotate around the first rotating shaft CX1 and the second rotating shaft CX2. The first folding part FA1 of the display device DD may be folded along the first and second rotating shafts CX1 and CX2, accordingly. Along a first rotational radius, the second plate PT2 may rotate to be disposed on the first plate PT1.

In this case, as shown in FIG. 8A, the first gear ST1a and the second gear ST1b are engaged with each other in the first gearbox GB1. In addition, the fifth gear ST3a and the sixth gear ST3b are disengaged from each other in the third gearbox GB3. For example, the fifth gear ST3a moves to approach the first plate PT1. Therefore, among the third connecting gears ST3c-1, ST3c-2, ST3c-3, and ST3c-4, two outermost connecting gears ST3c-1 and ST3c-4 are respectively engaged with the sixth gear ST3b and the fifth gear ST3a. The third rotating shaft CX3 connected to the fifth gear ST3a moves in the first direction DR1 in response to the folding of the first folding part FA1 so as to increase the distance between the third and fourth rotating shafts CX3 and CX4.

With reference to FIGS. 6B and 8B, the following will discuss an operation where the third plate PT3 moves onto the second plate PT2 after the second plate PT2 is disposed on the first plate PT1. When the third plate PT3 is disposed above the second plate PT2, the second folding part FA2 may be folded at the second radius of curvature.

In exemplary embodiments, the second radius of curvature may be greater than the first radius of curvature. The second folding part FA2 of the display device DD may be folded along the third and fourth rotating shafts CX3 and CX4 that are spaced from each other at an increased distance. The fifth gear ST3a and the sixth gear ST3b are disengaged from each other in the third gearbox GB3, and the seventh gear ST4a and the eighth gear ST4b are disengaged from each other in the fourth gearbox GB4, with the result that the second shortest distance between the third rotating shaft CX3 and the fourth rotating shaft CX4 increases. Therefore, the third plate PT3 may have an increased rotational radius when rotating around the third rotating shaft CX3 and the fourth rotating shaft CX4. As a result, the increase in the rotational radius of the third plate PT3 may increase the second radius of curvature of the second folding part FA2 of the display module (see DM of FIG. 4).

FIG. 8C shows operations of the first gearbox GB1 and the third gearbox GB3.

First, the first gear ST1a and the second gear ST1b rotate in opposite directions in the first gearbox GB1, while being engaged with each other. The first gear ST1 rotates in the counterclockwise direction, and the second gear ST1b rotates in the clockwise direction.

The fifth gear ST3a rotates in the clockwise direction in the third gearbox GB3. In this case, the third connecting gear ST3c-4 engaged with the fifth gear ST3a rotates in the counterclockwise direction. The third connecting gear ST3c-3 engaged with the third connecting gear ST3c-4 rotates in the clockwise direction, the third connecting gear ST3c-2 engaged with the third connecting gear ST3c-3 rotates in the counterclockwise direction, and the third connecting gear ST3c-1 engaged with the third connecting gear ST3c-2 rotates in the clockwise direction. The sixth gear ST3b rotates in the counterclockwise direction, while being engaged with the third connecting gear ST3c-1.

Accordingly, the fifth gear ST3a and the sixth gear ST3b may rotate in opposite directions. As such, each gearbox may include an even number of the connecting gears such that the gears connected to the rotating shafts may rotate in opposite directions.

Figure 9A:
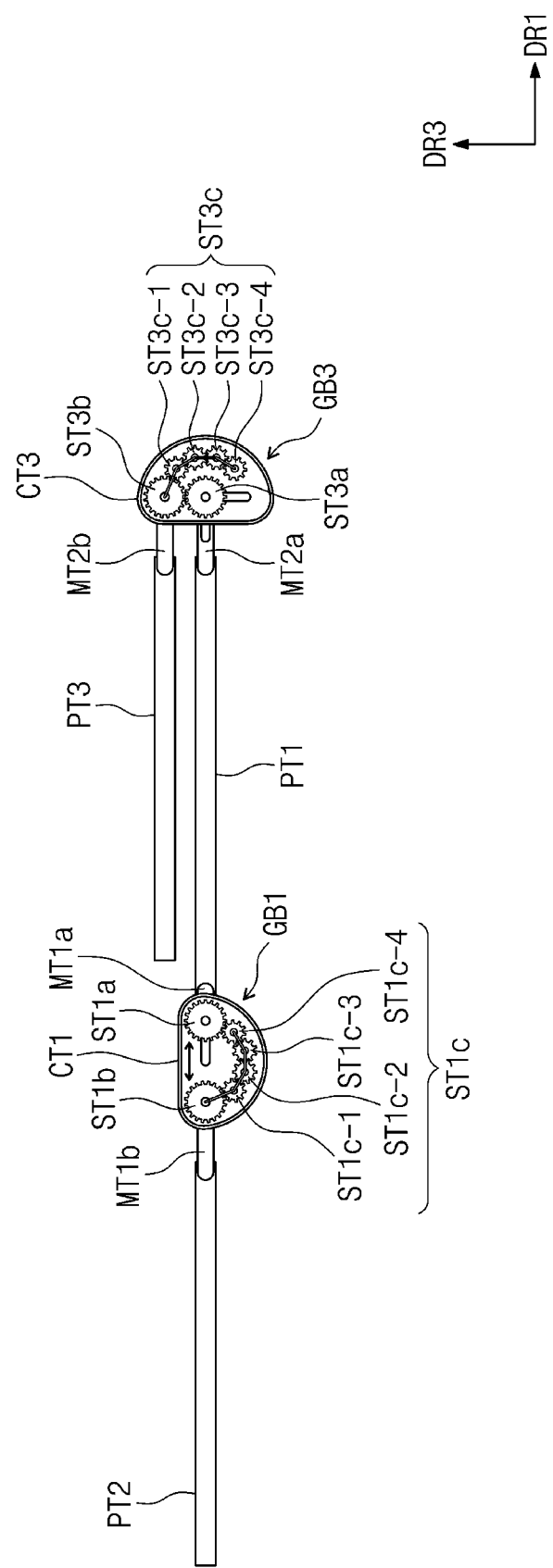
Figure 9C:
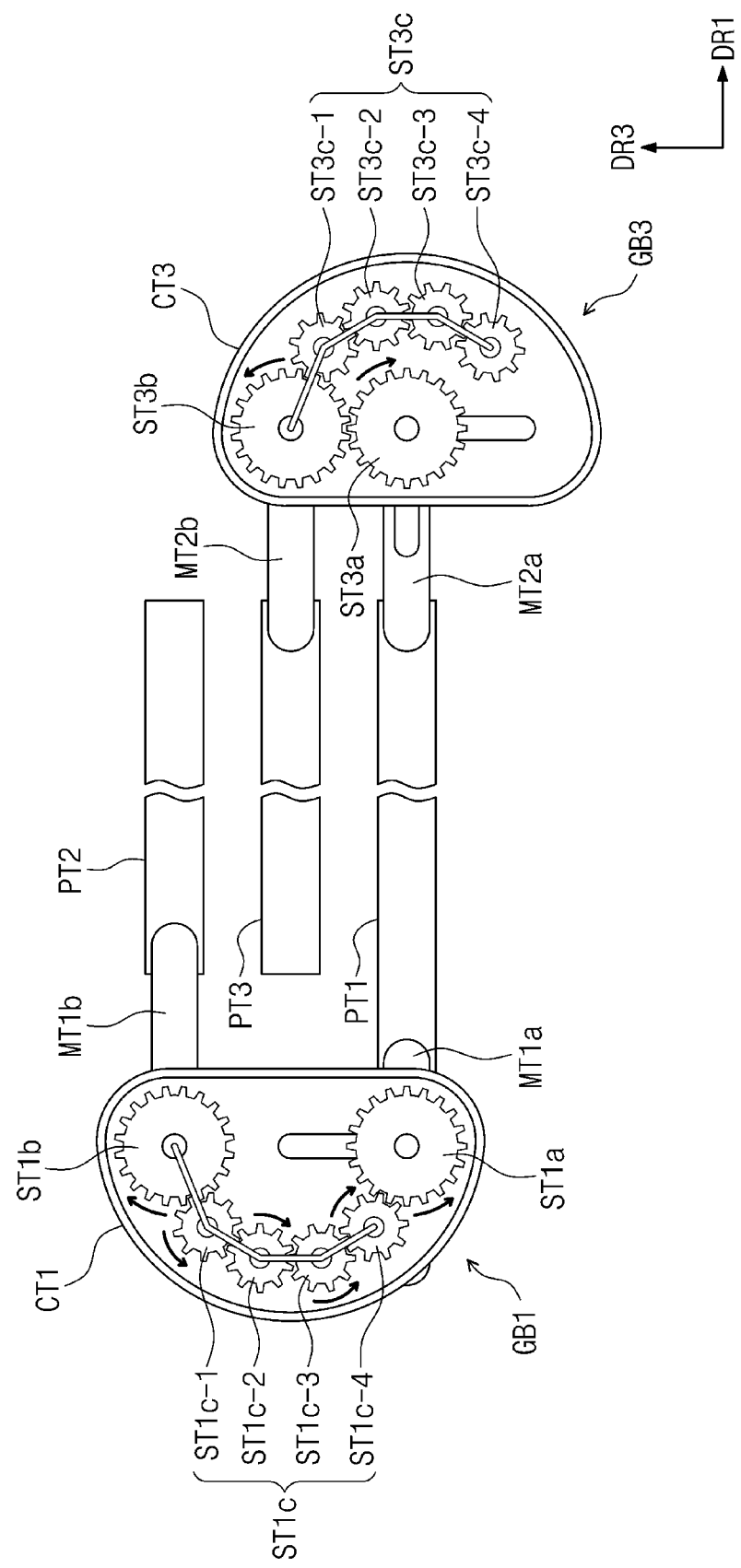

FIGS. 9A, 9B, and 9C are cross-sectional views of the hinge member of FIG. 7 folded in a second folding operation according to the principles of the invention.

With reference to FIGS. 9A to 9C, the following will discuss the second folding operation where the third plate PT3 moves onto the first plate PT1. The display device DD may be configured such that the second folding part FA2 may be folded at the second radius of curvature in the second folding operation which causes the third plate PT3 to face the first plate PT1.

Referring to FIGS. 6B and 9A, the third plate PT3 may rotate around the third rotating shaft CX3 and the fourth rotating shaft CX4. Along a second rotational radius, the third plate PT3 may rotate to be disposed on the first plate PT1. The second plate PT2 may rotate in a direction opposite to that of the third plate PT3.

As shown in FIG. 9A, the fifth gear ST3a and the sixth gear ST3b are engaged with each other in the third gearbox GB3. In addition, the first gear ST1a and the second gear ST1b are disengaged from each other in the first gearbox GB1. For example, the first gear ST1a moves to approach the first plate PT1. As a result, among the first connecting gears ST1c-1, ST1c-2, ST1c-3, and ST1c-4, two outermost connecting gears ST1c-1 and ST1c-4 are respectively engaged with the second gear ST1b and the first gear ST1a.

With reference to FIGS. 6B and 9B, the following will discuss an operation where the second plate PT2 moves onto the third plate PT3 after the third plate PT3 is disposed on the first plate PT1. When the second plate PT2 is disposed above the third plate PT3, the first folding part FA1 may be folded at the first radius of curvature.

In exemplary embodiments, the first radius of curvature may be greater than the second radius of curvature. The first gear ST1a and the second gear ST1b are disengaged from each other in the first gearbox GB1, the third gear ST2a and the fourth gear ST2b are disengaged from each other in the second gearbox GB2, with the result that the first shortest distance increases between the first rotating shaft CX1 and the second rotating shaft CX2. Therefore, the first plate PT1 may have an increased rotational radius when rotating around the first rotating shaft CX1 and the second rotating shaft CX2. As a result, the increase in the rotational radius of the first plate PT1 may increase the first radius of curvature of the first folding part FA1 of the display module DM.

FIG. 9C shows operations of the first gearbox GB1 and the third gearbox GB3.

First, the fifth gear ST3a and the sixth gear ST3b rotate in opposite directions in the third gearbox GB3, while being engaged with each other. The fifth gear ST3a rotates in the clockwise direction, and the sixth gear ST3b rotates in the counterclockwise direction.

The first gear ST1a rotates in the counterclockwise direction in the first gearbox GB1. In this case, the first connecting gear ST1c-4 engaged with the first gear ST1a rotates in the clockwise direction. The first connecting gear ST1c-3 engaged with the first connecting gear ST1c-4 rotates in the counterclockwise direction, the first connecting gear ST1c-2 engaged with the first connecting gear ST1c-3 rotates in the clockwise direction, and the first connecting gear ST1c-1 engaged with the first connecting gear ST1c-2 rotates in the counterclockwise direction. The second gear ST1b rotates in the clockwise direction, while being engaged with the first connecting gear ST1c-1. As a result, the first gear ST1a and the second gear ST1b rotate in opposite directions.

Figure 10:
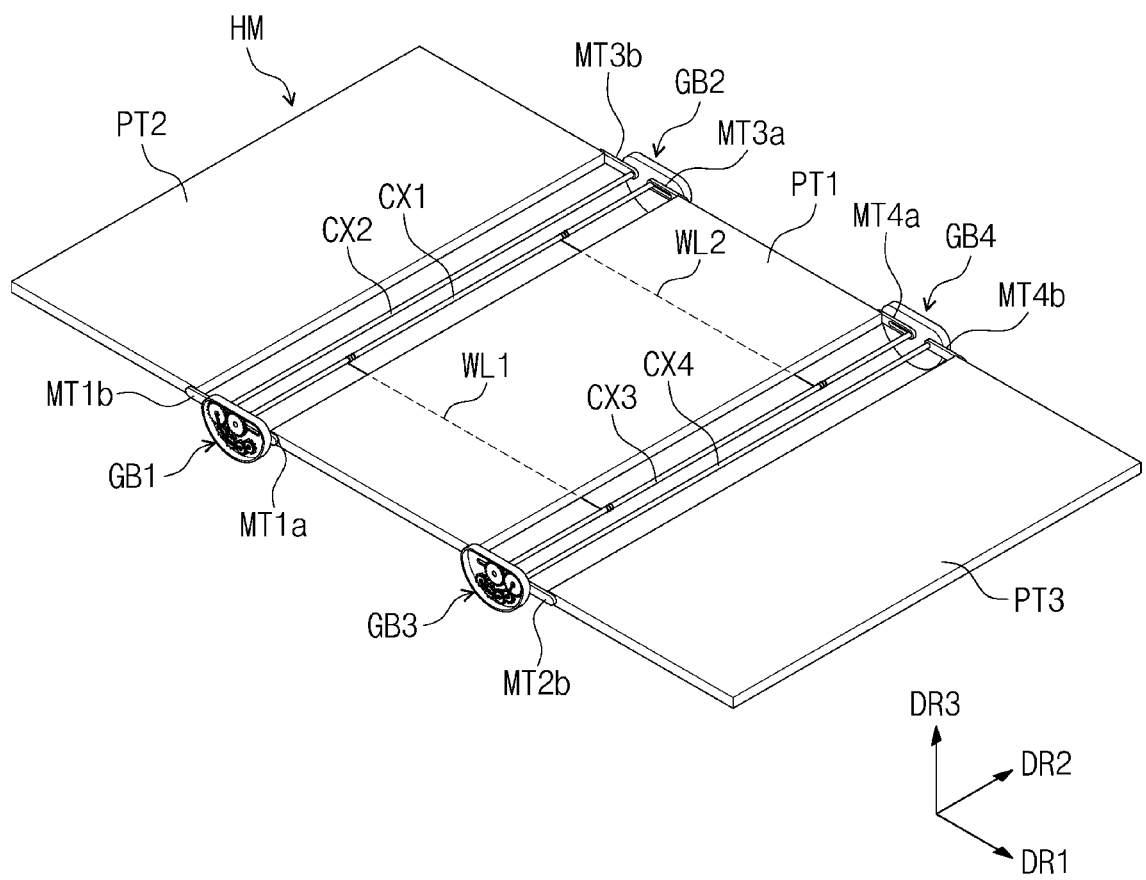
FIG. 10 is a perspective view of another exemplary embodiment of a hinge member constructed according to the principles of the invention.

FIG. 10 is a perspective view of another exemplary embodiment of a hinge member constructed according to the principles of the invention. FIG. 10 shows a biasing unit which is not illustrated in FIG. 4, and the biasing unit will be discussed in detail below. Overlapping description will be omitted for descriptive convenience and conciseness.

Referring to FIG. 10, the biasing unit includes at least one biasing member disposed between the first rotating shaft CX1 and the third rotating shaft CX3. In this description, the biasing unit is illustrated to include a first biasing member, which may be in the form of wire WL1 and a second biasing member, which may also be in the form of wire WL2.

The first wire WL1 and the second wire WL2 are spaced apart from each other in the second direction DR2, and each of the first and second wires WL1 and WL2 includes one end connected to the first rotating shaft CX1 and other end connected to the third rotating shaft CX3. The first and second wires WL1 and WL2 may overlap the first plate PT1.

As discussed above with reference to FIG. 8A, when the first folding operation is performed, the first gear ST1a in the first gearbox GB1 rotates in the same direction as that of the third gear ST2a in the second gearbox GB2. The rotation of the first and third gears ST1a and ST2a may rotate the first rotating shaft CX1 connected to the first and third gears ST1a and ST2a. In this case, the first rotating shaft CX1 may be wound with portions of the first and second wires WL1 and WL2 connected thereto.

Therefore, the third rotating shaft CX3 connected to the other ends of the first and second wires WL1 and WL2 may move along the first direction DR1 to approach the first plate PT1. As a result, as shown in FIG. 8A, the fifth gear ST3a and the sixth gear ST3b are disengaged from each other in the third gearbox GB3, and the seventh gear ST4a and the eighth gear ST4b are disengaged from each other in the fourth gearbox GB4. For example, the fifth gear ST3a and the seventh gear ST4a move in the first direction DR1 to approach the first plate PT1.

When the second folding operation is performed, the fifth gear ST3a in the third gearbox GB3 rotates in the same direction as that of the seventh gear ST4a in the fourth gearbox GB4. The rotation of the fifth and seventh gears ST3a and ST4a may rotate the third rotating shaft CX3 connected thereto. In this case, the third rotating shaft CX3 may be wound with portions of the first and second wires WL1 and WL2 connected thereto.

Therefore, the first rotating shaft CX1 connected to the one ends of the first and second wires WL1 and WL2 may move along the first direction DR1 to approach the first plate PT1. In this case, the first gear ST1a and the second gear ST1b are disengaged from each other in the first gearbox GB1, and the third gear ST2a and the fourth gear ST2b are disengaged from each other in the second gearbox GB2. For example, the first gear ST1a and the third gear ST2a move in the first direction DR1 to approach the first plate PT1.

In exemplary embodiments, each of the first and second wires WL1 and WL2 may be disposed below the first plate PT1. This arrangement is caused by that the first flat part NFA1 is disposed on the first plate PT1 with an adhesive layer therebetween.

Figure 11A:
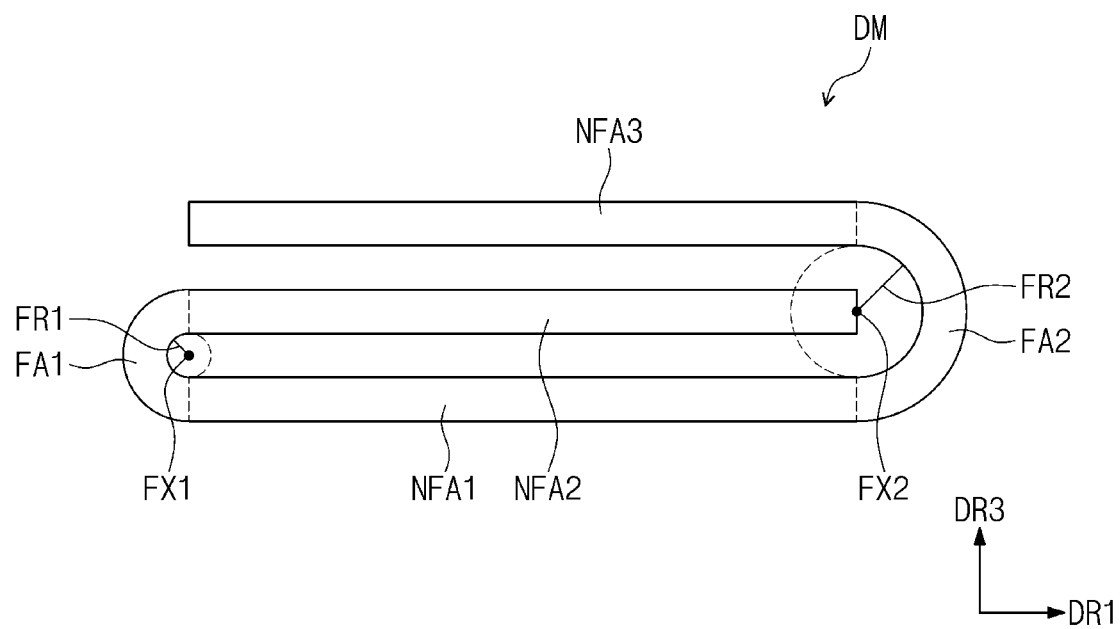
FIG. 11A is a cross-sectional view of an exemplary embodiment of a display device folded in a first folding operation according to the principles of the invention.
Figure 11B:
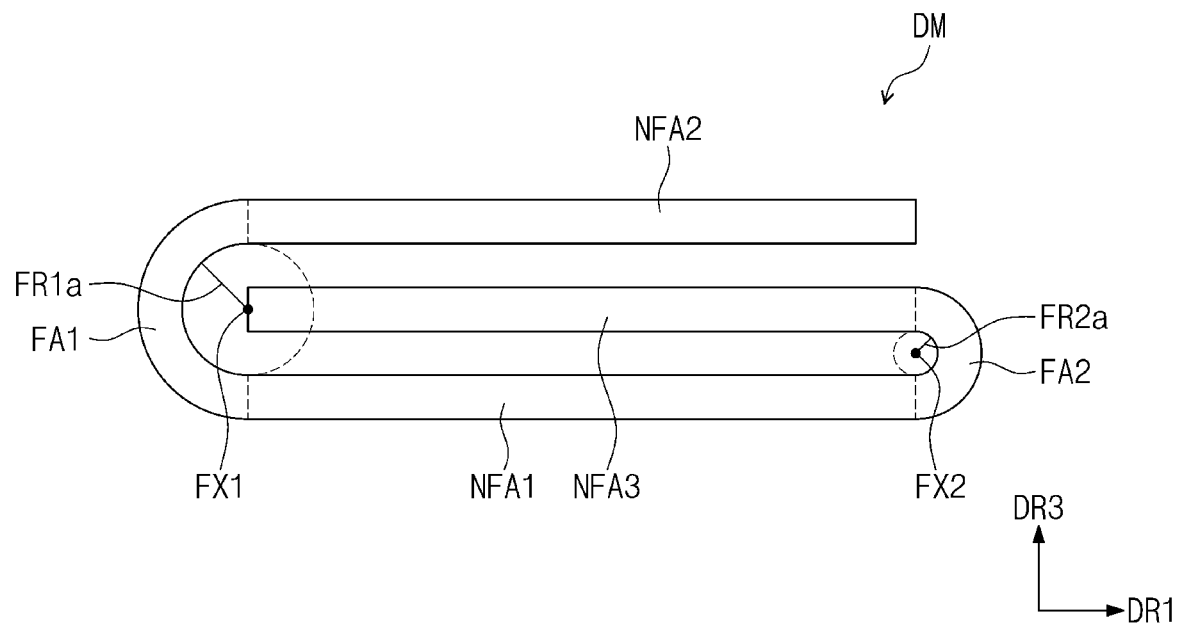
FIG. 11B is a cross-sectional view of an exemplary embodiment of a display device folded in a second folding operation constructed according to the principles of the invention.

FIG. 11A is a cross-sectional view of an exemplary embodiment of a display device folded in a first folding operation according to the principles of the invention. FIG. 11B is a cross-sectional view of an exemplary embodiment of a display device folded in a second folding operation constructed according to the principles of the invention.

Referring to FIG. 11A, when the first folding operation is performed, the first folding part FA1 of the display device DD may be folded at a first radius of curvature FR1. When the first folding part FA1 is folded, the second flat part NFA2 may be disposed on the first flat part NFA1. Thereafter, the second folding part FA2 may be folded at a second radius of curvature FR2. When the second folding part FA2 is folded, the third flat part NFA3 may be disposed on the second flat part NFA2.

When the first folding operation is performed, the second radius of curvature FR2 of the second folding part FA2 may be greater than the first radius of curvature FR1 of the first folding part FA1.

Referring to FIG. 11B, when the second folding operation is performed, the second folding part FA2 of the display device DD may be folded at a second radius of curvature FR2a. When the second folding part FA2 is folded, the third flat part NFA3 may be disposed on the first flat part NFA1. Thereafter, the first folding part FA1 may be folded at a first radius of curvature FR1a. When the first folding part FA1 is folded, the second flat part NFA2 may be disposed on the third flat part NFA3.

When the second folding operation is performed, the first radius of curvature FR1a of the first folding part FA1 may be greater than the second radius of curvature FR2a of the second folding part FA2.

According to the illustrated embodiment above, the first and second folding parts FA1 and FA2 may have respective first and second radii of curvature which are changed based on the folding sequence of the display device DD. In consequence, it may be possible to provide the display device DD capable of being folded at two folding parts in opposite directions regardless of the folding sequence.

According to one or more exemplary embodiments, the first and second folding parts may have respective first and second radii of curvature capable of being changed based on folding sequence of a display device. For example, when the first folding part is folded prior to the second folding part, the second folding part has a radius of curvature greater than that of the first folding part, but when the second folding part is folded prior to the first folding part, the first folding part has a radius of curvature greater than that of the second folding part.

Accordingly, the device display may be folded twice regardless of the folding sequence.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display module; and
a hinge member coupled to and at least partially overlapping the display module,
wherein the hinge member comprises:
first, second, and third plates which are spaced apart from each other, the first to third plates supporting the display module;
a first rotating shaft and a second rotating shaft to rotate the second plate relative to the first plate; and a third rotating shaft and a fourth rotating shaft to rotate the third plate relative to the first plate, the first and second rotating shafts being disposed between the first plate and the second plate, the third and fourth rotating shafts being disposed between the first plate and the third plate;
a first shaft support connected to one end of the first rotating shaft and one end of the second rotating shaft; and a second shaft support connected to other end of the first rotating shaft and other end of the second rotating shaft, the first and second shaft supports supporting at least one of the first and second rotating shafts for limited linear movement; and
a third shaft support connected to one end of the third rotating shaft and one end of the fourth rotating shaft; and a fourth shaft support connected to other end of the third rotating shaft and other end of the fourth rotating shaft, the third and fourth shaft supports supporting at least one of the third and fourth rotating shafts for limited linear movement, and
wherein rotation of at least one of the third and fourth rotating shafts to rotate the third plate relative to the first plate causes limited linear movement of at least one of the first and second rotating shafts.

2. The display device of claim 1, wherein the first and second rotating shafts are spaced from each other at a first distance or a second distance greater than the first distance, and when the third plate rotates to face the first plate, the first and second shafts are spaced at the second distance.

3. The display device of claim 1, wherein rotation of at least one of the first and second rotating shafts to rotate the second plate causes limited linear movement of at least one of the third and fourth rotating shafts, the third and fourth rotating shafts are spaced from each other at a first distance or a second distance greater than the first distance, and when the second plate rotates to face the first plate, the third and fourth rotating shafts are spaced at the second distance.

4. The display device of claim 1, wherein, when the first to third plates are linearly arranged, the first and second rotating shafts are spaced from each other at the same distance as the distance between the third and fourth rotating shafts.

5. The display device of claim 1,
wherein the first and second shaft supports comprise first and second gearboxes, respectively, and the first gearbox includes:
a first main gear coupled to the one end of the first rotating shaft;
a second main gear coupled to the one end of the second rotating shaft; and
a plurality of first sub-gears engaged with each other and one of which is engaged with the second main gear, the number of the first sub-gears being an even number, and
wherein the third and fourth shaft supports comprise third and fourth gearboxes, respectively, and the third gearbox includes:
a third main gear coupled to the one end of the third rotating shaft;
a fourth main gear coupled to the one end of the fourth rotating shaft; and
a plurality of second sub-gears engaged with each other and one of which is engaged with the fourth main gear, the number of the second sub-gears being an even number.

6. The display device of claim 5, wherein, when the first to third plates have a first position in which they are substantially linearly arranged,
the first main gear and the second main gear are configured to be engaged with each other, and
the third main gear and the fourth main gear are configured to be engaged with each other.

7. The display device of claim 5, wherein, when the second plate is rotatable to face the first plate,
the first main gear and the second main gear are configured to be engaged with each other, and
the third main gear and the fourth main gear are configured to be disengaged from each other.

8. The display device of claim 7, wherein two outermost ones of the second sub-gears are respectively configured to be engaged with the third main gear and the fourth main gear.

9. The display device of claim 5, wherein, when the third plate is rotatable to face the first plate,
the third main gear and the fourth main gear are configured to be engaged with each other, and
the first main gear and the second main gear are configured to be spaced apart from each other.

10. The display device of claim 9, wherein two outermost ones of the first sub-gears are respectively configured to be engaged with the first main gear and the second main gear.

11. The display device of claim 5,
wherein the second gearbox includes:
a fifth main gear coupled to the other end of the first rotating shaft;
a sixth main gear coupled to the other end of the second rotating shaft; and
a plurality of third sub-gears configured to be engaged with each other and with the sixth main gear, the number of the third sub-gears being an even number, and
wherein the fourth gearbox includes:
a seventh main gear coupled to the other end of the third rotating shaft;
an eighth main gear coupled to the other end of the fourth rotating shaft; and
a plurality of fourth sub-gears configured to be engaged with each other and with the eighth main gear, the number of the fourth sub-gears being an even number.

12. The display device of claim 1, wherein the display module includes:
first, second, and third parts respectively overlapping the first, second, and third plates;
a first folding part between the first flat part and the second flat part; and
a second folding part between the first flat part and the third flat part.

13. The display device of claim 1, wherein
the first rotating shaft is adjacent to one side of the first plate,
the second rotating shaft is adjacent to one side of the second plate, the one side of the second plate facing the one side of the first plate,
the third rotating shaft is adjacent to other side of the first plate, and
the fourth rotating shaft is adjacent to one side of the third plate, the one side of the third plate facing the other side of the first plate.

14. The display device of claim 13, further comprising:
a first coupler including: a first supporter having a first through hole through which the first rotating shaft passes; and a second supporter having a second through hole through which the second rotating shaft passes, the first supporter being between the first plate and the first shaft support, the second supporter being between the second plate and the first shaft support; and a second coupler including: a third supporter having a third through hole through which the third rotating shaft passes; and a fourth supporter having a fourth through hole through which the fourth rotating shaft passes, the third supporter being between the first plate and the third shaft support, the fourth supporter being between the third plate and the third shaft support, wherein each of the first and third through holes has an elongate shape forming part of lost motion connection.

15. The display device of claim 14, wherein, when the third plate is rotatable to face the first plate, the first rotating shaft is configured to move along the first through hole to approach the first plate.

16. The display device of claim 14, wherein, when the second plate is rotatable to face the first plate, the third rotating shaft is configured to move along the third through hole to approach the first plate.

17. The display device of claim 15, further comprising:
a third coupler including: a fifth supporter having a fifth through hole through which the first rotating shaft passes; and a sixth supporter having a sixth through hole through which the second rotating shaft passes, the fifth supporter being between the first plate and the second shaft support, the sixth supporter being between the second plate and the second shaft support; and a fourth coupler including: a seventh supporter having a seventh through hole through which the third rotating shaft passes; and an eighth supporter having an eighth through hole through which the fourth rotating shaft passes, the seventh supporter being between the first plate and the fourth shaft support, the eighth supporter being between the third plate and the fourth shaft support, wherein each of the fifth and seventh through holes has an elongate shape forming part of a lost motion connection.

18. The display device of claim 1, further comprising at least one biasing member including one end connected to the first rotating shaft and other end connected to the third rotating shaft, wherein, when the second plate rotates to face the first plate, the first rotating shaft is biased by the biasing member to allow the third rotating shaft to move closer to the first plate, and wherein, when the third plate rotates to face the first plate, the third rotating shaft is biased by the biasing member to allow the first rotating shaft to move closer to the first plate.

19. The display device of claim 18, wherein the biasing member comprises a wire disposed below the first plate.

20. The display device of claim 1, further comprising:
a first spring unit between the first plate and the second plate; and
a second spring unit between the first plate and the third plate.

* * * * *